(12) United States Patent
Ramm et al.

(10) Patent No.: US 9,945,024 B2
(45) Date of Patent: Apr. 17, 2018

(54) METHOD FOR PRODUCING CUBIC ZIRCONIA LAYERS

(75) Inventors: Jürgen Ramm, Maienfeld (CH); Beno Widrig, Bad Ragaz (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 1162 days.

(21) Appl. No.: 13/497,283

(22) PCT Filed: Sep. 24, 2010

(86) PCT No.: PCT/EP2010/064136
§ 371 (c)(1),
(2), (4) Date: Mar. 21, 2012

(87) PCT Pub. No.: WO2011/036246
PCT Pub. Date: Mar. 31, 2011

(65) Prior Publication Data
US 2013/0153408 A1    Jun. 20, 2013

Related U.S. Application Data

(60) Provisional application No. 61/245,750, filed on Sep. 25, 2009.

(51) Int. Cl.
*C23C 14/00* (2006.01)
*C23C 14/24* (2006.01)
(Continued)

(52) U.S. Cl.
CPC .......... *C23C 14/24* (2013.01); *C23C 14/0021* (2013.01); *C23C 14/0676* (2013.01);
(Continued)

(58) Field of Classification Search
CPC ............ C23C 14/0021; C23C 14/0036; C23C 14/0042; C23C 14/08; C23C 14/325; C23C 14/3485
(Continued)

(56) References Cited

U.S. PATENT DOCUMENTS 5,418,003 A    5/1995 Bruce et al.
5,518,597 A    5/1996 Storer et al.
(Continued)

FOREIGN PATENT DOCUMENTS

| | | | |
|---|---|---|---|
| DE | 102006046126 A1 * | 1/2008 | |
| EP | 0669901 A1 | 9/1995 | |
| WO | 94/11322 A1 | 5/1994 | |

OTHER PUBLICATIONS

Cyviene, et al., "Deposition of Nanocomposite Zr—ZrO2 Films by Reactive Cathodic Vacuum Arc Evaporation", Materials Science and Engineering B, Elsevier Sequoia, Lausanne, CH, Apr. 25, 2005.
(Continued)

*Primary Examiner* — Timon Wanga
(74) *Attorney, Agent, or Firm* — Pearne & Gordon LLP

(57) ABSTRACT

In order to produce zirconia-based layers on a deposition substrate, wherein reactive spark deposition using pulsed spark current and/or the application of a magnetic field that is perpendicular to the spark target are employed, a mixed target comprising elemental zircon and at least one stabilizer is used, or a zirconium target comprising elemental zirconium is used, wherein in addition to oxygen, nitrogen is used as the reactive gas. As an alternative, combined with the use of the mixed target, nitrogen can also be used as the reactive gas in addition to oxygen.

30 Claims, 44 Drawing Sheets

(51) Int. Cl.
  *C23C 14/06* (2006.01)
  *C23C 14/08* (2006.01)
  *C23C 14/32* (2006.01)
  *C23C 14/34* (2006.01)

(52) U.S. Cl.
  CPC .......... *C23C 14/083* (2013.01); *C23C 14/325* (2013.01); *C23C 14/0036* (2013.01); *C23C 14/0042* (2013.01); *C23C 14/3485* (2013.01)

(58) Field of Classification Search
  USPC ............... 428/702; 427/248.1; 174/126.2
  See application file for complete search history.

(56) References Cited

U.S. PATENT DOCUMENTS

| | | |
|---|---|---|
| 5,709,786 A | 1/1998 | Friese et al. |
| 5,872,070 A | 2/1999 | Dismukes et al. |
| 6,042,878 A | 3/2000 | Bruce |
| 6,143,437 A | 11/2000 | Kondou et al. |
| 6,245,280 B1 | 6/2001 | Tan et al. |
| 6,391,164 B1 | 5/2002 | Beilis et al. |
| 6,586,115 B2 | 7/2003 | Rigney et al. |
| 2002/0031686 A1 | 3/2002 | Jia et al. |
| 2004/0022949 A1 | 2/2004 | Hasezaki et al. |
| 2004/0084309 A1 | 5/2004 | Ando et al. |
| 2005/0170200 A1 | 8/2005 | Nagaraj et al. |
| 2006/0009344 A1 | 1/2006 | Sone et al. |
| 2006/0171813 A1 | 8/2006 | Malak et al. |
| 2007/0000772 A1 | 1/2007 | Ramm et al. |
| 2007/0004589 A1 | 1/2007 | Kimura et al. |
| 2007/0237971 A1 | 10/2007 | Saint-Ramond et al. |
| 2008/0020138 A1* | 1/2008 | Ramm et al. .............. 427/248.1 |
| 2008/0088067 A1 | 4/2008 | Saint-Ramond et al. |
| 2008/0090099 A1 | 4/2008 | Ramm et al. |
| 2008/0090100 A1 | 4/2008 | Saint-Ramond et al. |
| 2009/0286105 A1* | 11/2009 | Severin et al. ............... 428/702 |
| 2010/0170696 A1* | 7/2010 | Yano et al. ................. 174/126.2 |

OTHER PUBLICATIONS

Weifeng, et al., "Structure and Properties of Zirconia (Zr02) Films Fabricated by Plasma-assisted Cathodic Arc Deposition: Structure and Properties of Zirconia (Zr02) Films", Journal of Physics D. Applied Physics, IOP Publishing, Bristol, GB, BD. 10, Nr. 8, Apr. 21, 2007.

Laurikaitis, et al., "Depsition of Zirconium Oxynitride Films by Reactive Cathodic Arc Evaporation and Investigation of Physical Properties", Thin Solid Films, Elsevier-Sequoia S.A., Lausanne, CH, Bd. 516, Nr. 7, Jan. 29, 2008.

International Search Report for PCT/EP2010/064136 dated Apr. 15, 2011.

Written Opinion for PCT/EP2010/064136 dated Apr. 15, 2011.

* cited by examiner

Legend to Figure 20:

- - - - - - -  ZrN or ZrO, cubic Phase
───────  $ZrO_2 / Zr(N,O)_2$, cubic phase
  m    $ZrO_2$, monoclinic phase
  o    $ZrO_2$, orthorhombic phase Legend to Figure 23:

c     {ZrYO}, cubic phase

---------- SL, ZrN, hexagonal phase

_____ SL, ZrN, cubic phase

Legend to Figure 24:

t     {ZrYO}, tetragonal
——— SL, TiCN, cubic phase

METHOD FOR PRODUCING CUBIC ZIRCONIA LAYERS

The invention relates to a method for producing zirconia layers as well as to layers and/or layer systems containing zirconia. The invention also relates to products with zirconia layers and their applications.

Zirconia-based layers are interesting primarily in their cubic and/or tetragonal forms, for example as regards their use in solid electrolyte fuel cells.

The ion conductivity of the zirconia-based layers and their thermal stability however also enable them to be used in the field of sensor technology.

In this field too, one preferably relies on the cubic crystal structure, as described for example in US_20040084309: the document describes a sensor, based on a Zr—O layer that is tetragonal or cubic and contains less than 5 mol % additives of the monoclinic phase. The necessity of limiting the monoclinic phase is substantiated in that the crack formation when exposed to temperature change stress can be avoided, which arises because of the volume changes at phase transitions. The monoclinic phase is avoided by means of stabilizing agents. Paragraph 101 also describes that a small average grain size (less than 2.5 micrometers) in the layer is advantageous, as it behaves in a more stable manner during phase transformations. In paragraph 103, preferred ratios of cubit phase to tetragonal phase are indicated (400) for the cubic phase (004) and (220) for the tetragonal phase.

Because of the good mechanical properties in connection with the good thermal barrier behavior, the layers could also advantageously be used in the field of tool coating, in particular for the coating of components. The focus here is on the design of tribological systems. The adjustable morphology in connection with the adjustable hardness of the layers and the easy combination with other oxide layers can be used to optimize the wear and tear of coated workpieces/components and for the wear of the counter body.

Another application is described in US_20070004589: a mixture of tetragonal and cubic Zr—O is used with the addition of stabilizers for application in catalyzers.

Zirconia-based layers can be described in relation to their composition primarily as Zr—O, Zr—O—N, Zr-St-O, Zr-St-O—N, where St stands for stabilizer elements that contribute to stabilizing the cubic resp. tetragonal structure of the ZrO2. As stabilizer, Y is preferably used. In the state of the art, various methods for producing zirconia-based layers are known and will be briefly described hereafter.

a) Layers Produced by Sintering:

In US_05709786 resp. EP_00669901, a sintering process for producing solid electrolytes from Zr—O is described. The adjunction of stabilizers to increase the ion conductivity of the Zr—O is discussed, as well also as the cosintering with metallic and ceramic powders for creating contacts in connection with the solid electrolyte. According to this prior art, the fact that powder with a grain size in the nanometer range reduces the temperature dependency of the ion conductivity and that the small size of the powder during the sintering process is advantageous and reduces the temperature required for sintering is described as an essential characteristic. This is discussed especially in connection with the fact that some stabilizers advantageous for increasing the ion conductivity can be sintered at usual powder sizes only at very high temperatures. The document describes the difficulties of producing layers during the sintering process and shows a possible solution by reducing the powder size. The layers are not characterized analytically, but the document demonstrates the necessity that it is advantageous for particular applications to make the layer hardness and other mechanical properties of the Zr—O layer in the tribological system adjustable.

The Zr—O layers of US_20040084309, which are suitable for being used in a sensor, are also produced in a sintering process.

During the sintering process, the high temperatures required will however cause considerable disadvantages. In order to reduce these, expensive powders in the nanometer range are used as source materials. In the case of high-melting materials, the usual sintering temperatures (around 1500° C.) must be further increased in order to make the sintering process possible. This is in particular the case when stabilizing high-melting elements are added, as described in US_05709786. From this document, it is also clear that it is important to combine the solid electrolyte layer with other functional layers (e.g. electrodes) resp. with mechanical and thermal protection layers. This means that it is necessary for the application to produce a complete layer stack with functions matched to one another, with the production temperatures having to be adapted to one another in order to achieve a good layer stack (e.g. interface problems, layer stability). It is also clear from the document that high production temperatures are advantageous in terms of materials for including stabilizers but however cannot be achieved easily and are even harder to achieve for a layered compound structure.

Additionally, the layers produced by the sintering method must be considered rather compact materials. They must often be further stabilized (e.g. through meshes) in order to guarantee the mechanical bonding. Which structure of the Zr—O is obtained will depend on the sintering temperature and stabilizers are necessary to achieve the cubic or tetragonal structure. The phases that arise in this method correspond essentially to what can be read in the phase diagram, because the processes essentially occur at thermal equilibrium. There are stabilizers that can be sintered only at very high temperatures and thus are technically difficult or even impossible to achieve. This will thus limit the possible range of layers.

The "coupling" of the sintered layer to other materials is difficult, since different temperatures are necessary to establish a bonding and the material to be bonded will limit the temperature range. The layers are fragile, such as porcelain for example, and it is nearly impossible to produce multilayer structures. The grain size of the produced materials are determined by the starting powder and the sintering process. Simply applying thermal protection layers or metal electrodes cannot take place in one process.

The source materials are of fundamental importance for sintering (grain size) in order to produce cubic resp. tetragonal ZrO2 layers. In both cases, a lot of effort is required in order to ensure reproducibility in the source material. An improved production method should therefore ensure both the production method of the source material (target) as well as the consistency over time of the material's quality during the coating process.

b) Layers Produced by Plasma Spraying:

US_20040022949 discloses a wear-protection coating for gas turbines made of cubic or tetragonal Zr—O that is produced by plasma spraying. A water steam treatment transforms this layer into a softer monoclinic structure that, when used in a gas turbine, transforms again into a cubic or tetragonal structure. The aim of this additional layer treatment is to design the run-in behavior of the component in such a manner that the counter body is not damaged and the soft layer is adapted. The usual stabilizers are again used, with yttrium oxide (Y—O) being indicated to be in the range between 0.3 and 20 mol %.

In US_20050170200, a thermal barrier layer is described that consists of a bonding coat, a partially stabilized Zr—O layer and a further completely stabilized Zr—O layer. The good mechanical properties of the partially stabilized Zr—O are thus combined with the good thermal protection characteristics of the completely stabilized Zr—O. The layers are produced by means of plasma spraying.

The interface problem mentioned in connection with the sintering method also exists in the thermal spraying method. Here too it is difficult to achieve a good bonding between the deposited layer and the substrate to be coated. Furthermore, it is difficult to achieve with this method a gradual transition between different materials.

As with sintering, in the case of electron beam evaporation (pre-treated crucible material) the source materials will be of fundamental importance in order to produce high-quality cubic resp. tetragonal ZrO2 layers. In both cases, great effort is required in order to ensure reproducibility in the source material. An improved production method should therefore ensure both the production method of the source material (target) as well as the consistency over time of the material's quality during the coating process c) Layers Produced by Means of Electron Beam Evaporation:

US_20060171813 describes an application of Zr—O layers on turbine blades. Onto an inner thick layer containing Zr—O or Hf—O, an additional thermal protection layer is applied consisting of a multi-layer coating consisting of Zr—O and a metallic oxide, for example Ta—O or Nb—O. The layers are deposited by means of electron beam evaporation.

US_20080090100 A1 describes a thermal barrier layer produced by means of electron beam evaporation.

In US_05418003, a PVD process (electron beam evaporation) is described that serves for producing thermal barrier layers on an Zr—O basis. In order to reduce the spurts during evaporation, a special pre-treatment of the crucible material (ingot) is indicated in US_06042878 A.

In US_6586115, various PVD and CVD (Chemical Vapor Deposition) methods are mentioned for applying thermal barrier coatings (TBC), without going into further details of the processes. In this connection, the electron beam evaporation of yttria-stabilized oxide is mentioned.

Electron beam evaporation generally enables a good bonding, as it occurs under vacuum and the substrate surfaces can be cleaned and activated by plasma treatment. Nevertheless, the degree of ionization of the evaporated material in electron beam evaporation is low, which usually allows only a columnar growth of the layers, which is desired for thermal protection layers but is a disadvantage for other applications, taking into consideration the aspect of bonding. The higher degree of ionization of the vapor would be advantageous considering that it would enable a higher energy to be brought into the layer synthesis through a substrate bias and thus to create better conditions for the tetragonal or cubic structures to be reached in the ZrO2, even without incorporation of stabilizers. However, this has not been achieved here or in other PVD processes. A further substantial disadvantage of this method is the effort that needs to be expended in order to achieve an evaporation that is as spatter-free as possible. In fact, in order to be able to oxidize the deposited layers consistently, oxides are added to the crucible material resp. only oxides are used. As these are insulating, the melting resp. sublimating of the oxides with the electron beam is not without problems in terms of spatters but also as regards a phase separation of the crucible material. Both are reflected in a complicated process procedure. Furthermore, it is necessary to add additional oxygen as reactive gas during the process in order to provide sufficient oxygen to the layer.

A further problem can be seen in the fact that during electron beam evaporation, the material is melted abruptly. Because of this, a high temperature gradient is formed in the crucible, which not seldom leads to crucible breakage and renders it unusable. This problem in relation to zirconia is addressed in US_06143437. The crucible used there already includes zirconia oxide powder in cubic phase.

US_20070237971 also discloses the use of a target with a special composition of a ceramic powder for electron beam evaporation. The laborious method for producing this target is described in US_20080088067. The economic use of the process is however considerably offset by the costs involved.

It must be emphasized again that the layers produced with the electron beam method usually allows only a columnar structure of the layers, as the degree of ionization of the metal vapor is too low for the mobility at the substrate surface to be increased. This of course also limits the influence on the layer structure. The care of the melt is another weak point of the method. It must be carried out in a very careful and laborious manner so as to avoid phase separations which would affect the layer composition. An evaporation of alloys is hardly possible, i.e. it is necessary to use the technically much more difficult oxide evaporation with adjunction of oxygen to achieve reasonably stoichiometric layers.

d) Layers by Means of Ion Beam Assisted Deposition (IBAD):

US_20020031686 discloses among others an IBAD method that allows the production of strongly (bi-axially) oriented YSZ (yttria-stabilized zirconia) on a SiO2 layer. The figures show the reflections (200) and (400) in the XRD spectrum for the YSZ. The YSZ in this application serves as growth substrate for the subsequent layer, in this application Ce—O, Ru—O and/or LSCO (Lanthanum Strontium Cobalt Oxide). The aim is to produce a conductive oxide from these materials, for which the YSZ substrate is required. In this document, examples for producing YSZ layers are indicated that have been deposited at a substrate temperature of 700° C. Without further proof, it is further alleged that the process can be extended to lower temperatures between 450° C. and 600"C. The low process temperature is a desirable property or condition in case the layers are to be deposited on previously pre-fabricated substrates, for example Si-wafers in the field of semi-conductors. The document US_20020031686 discloses the reflections (200) and (400) in the XRD spectrum for the YSZ in 2Θ range between 20° and 80°. The IBAD method is described in US_05872070.

The IBAD method is based on the bombarding of surfaces, once for ablating material, then to compel a certain growth direction of the material deposited under vacuum. The problem in this respect is that the growth rates with this technology are small and are not suitable for applications in which lots of material must be deposited over a wide surface and at low cost.

It appears remarkable that the reflections in US_20020031686, for which one would expect the highest intensity in the tetragonal resp. cubic ZrO2 (at 2Θ=30° and 50°) can almost not be evidenced. This is an indication that the IBAD method through the ion bombardment will yield strongly textured layers and it is questionable how great the proportions of the cubic YSZ really are. It is however also a clue that in this process, substrate temperatures of after all 700° C. are not sufficient in order to achieve a distinctly cubic phase in the ZrO2.

e) Layers in Combined PVD (Physical Vapor Deposition) Process (Sputter Deposition/Spark Evaporation):

In *J. Cyviene et al., Surface and Coatings Technology*, 180-181 (2004) 53-58, a combination of sputtering and spark evaporation is described. In this connection, a Zr target is used for the spark evaporation and a Y target for the sputter source. The process takes place under a process pressure of 0.2 Pa, with oxygen being added to the argon up to a maximum partial pressure of 0.08 Pa.

However, the combined method of sputtering and spark evaporation described in Cyviene_Surf.CoatTech_180-181_2004 sheds light on several problems that concern both the production method as well as the deposited layer. The document addresses the problem of the poisoning of the sputter target, i.e. it describes that when operating the sputter target, one must work at the edge to the metallic mode, which requires an intensive process control. Both the sputter operation as well as the spark evaporation operation take place in the argon working gas and oxygen is added only in small quantities. The operation in pure oxygen is not described, would however lead, without further measures, to complete instabilities in the described conditions: nearly no rate left for sputtering, instable spark evaporation because of auto-oxidation of the spark target and of the spark anode and finally interruption of the DC spark discharge.

Cyviene describes the problems on the layer side of combined sputter-spark evaporation, which are avoided by the present invention. It is described that the arc discharge with the Zr target in argon with adjunction of oxygen will not lead in the synthetized layer to the cubic resp. tetragonal phase, but rather that only a monoclinic structure is achieved. It is only through the adjunction of Y as stabilizer over the sputter process that YSZ can be demonstrated in the cubic resp. tetragonal phase. This is incidentally also confirmed in the experience of the inventors of the present invention who managed, as is described in US_20080090099_A1 (table 3, V—N° 29), to also produce ZrO2 in a stable arc process with exclusive oxygen atmosphere and at considerably higher pressures but yet could also not demonstrate any cubic resp. tetragonal structure of the ZrO2, quite the opposite of the "high-temperature" corundum structures in the material system Al—Cr—O described there.

From the XRD spectrum in Cyviene_Surf.CoatTech_180-181_2004, another issue becomes clear. The Bragg peaks of the hexagonal phase of the Y—O and of the hexagonal Zr can be seen. These are layer components that can contributed in an essential manner to layer instabilities, should thermal stress variations occur, as is usually the case in applications as solid electrolyte or thermal barrier layer.

These problems also partly overlap with those arising in connection with the BAD: poisoning symptoms of the target, layer compositions that contain other material components, and the resulting difficulty in controlling the crystal structure of the synthetized layer at the low substrate temperatures between 200° C. and 600° C.

Furthermore, as has already been observed further above, the reflections in US_20020031686, for which one would expect the highest intensity in the tetragonal resp. cubic ZrO2 (at 2Θ=30° and 50°) can almost not be evidenced. There is therefore very probably only a very small proportion of the cubic YSZ.

f) Other Methods:

US_20060009344 describes the production of a Zr—O substrate that comprises components both of monoclinic as well as of cubic structure of the Zr—O and that is thus particularly suitable for creating a greater bonding to the true cubic Zr—O layer. The method is an aerosol "CVD" method. Particular emphasis is again placed on the fact that the grain sizes should be between 5 nm and 1000 nm and again the Zr—O is stabilized with Y—O between 4 mol % and 8 mol %.

All the described methods lead to the conclusion that there is a great need arising out of the state of the art for improved zirconia layers, as well as a need for a cost-efficient and technically feasible method for producing such layers.

The present invention therefore has the aim of proposing a method for producing zirconia layers that are afflicted considerably less or not at all with the problems depicted above from the state of the art.

The present invention should also propose a method producing zirconia layers that makes it possible to regulate to a large extent and essentially without great changes of the layer composition the morphology and in particular the size of the crystallites.

The present invention also has the aim of disclosing zirconia layers that have essentially a cubic and/or tetragonal structure and that, as compared to the state of the art, comprise a smaller amount of components that are not cubic zirconia or not tetragonal zirconia. This relates both to layers that have one or several classical stabilizers as to those without classical stabilizers.

Classical stabilizers in the framework of this description will refer to stabilizers that are present in pure form as solid-state body at room temperature and at normal pressure. Examples of such classical stabilizers are yttrium, magnesium, calcium, scandium and/or the metals of the rare-earth subgroup IIIA of the periodic system. We will additionally mention Sr, Ba, Ni, Fe, Co, La, Nd, Gd, Dy, Ce, Al, Bi, Ti, Tb, Eu, Sm. These so-called stabilizers are found again as oxides or mixed oxides in the synthetized layer. The concept of classical stabilizer should also apply to compounds of the materials mentioned above by way of example.

The aim is achieved by methods that are based on reactive arc vaporization, using either pulsed spark current and/or a preferably small perpendicular magnetic field on the spark target. Generic methods for producing layers have already been described in patent applications US_20070000772 A1 and US_20080020138 A1 and are assumed here to be known. Document US_20080090099 A1 in particular also describes the production of ZrO2 layers. The process is designed to be so stable that the spark targets can be operated in reactive gas pressures between 0.1 Pa and 10 Pa.

In contrast to the methods described therein, additional measures are taken according to the present invention in order to deposit zirconia in the cubic and/or tetragonal crystal structure onto substrates.

In a first embodiment of the present invention, the aim is achieved by a method for producing a zirconia-based layer on a deposition substrate, wherein reactive spark deposition using pulsed spark current and/or the application of a magnetic field that is perpendicular to the spark target are employed, wherein a mixed target comprising elemental zircon and at least one stabilizer is used.

In a variant of this embodiment, the layer is produced in a cubic and/or tetragonal crystal structure.

According to the first embodiment of the present invention, one inventive measure consists in using for the spark evaporation a mixed target that comprises elemental zircon and/or several classical stabilizers in the concentration ration desired in the layer. As has surprisingly turned out, by means of pulsed spark source and/or by means of low perpendicular magnetic field it is possible to operate such a zircon-stabilizer mixed target without problem under oxygen pressures that are considerably higher than 0.1 Pa and can be even up to 10 Pa and in excess thereof.

In a variant of this embodiment, the oxygen partial pressure is thus chosen to be greater than 0.1 Pa, preferably at least 10 Pa.

The concentration ratios of the mixed target will essentially be reproduced in the concentration ratios of the layers deposited onto the substrates, and this essentially independently of the oxygen pressure.

In a variant of this embodiment, the concentration ratio of zirconia and stabilizer of the layer is thus essentially given by the concentration ratio of elemental zirconium and stabilizer of the mixed target.

If the stabilizer concentration is sufficiently high, the conditions are met for the cubic and/or tetragonal crystal structure to be automatically present. The oxygen pressure can be a partial pressure or a total pressure.

In a variant of this embodiment, the cubic and/or tetragonal crystal structure is thus achieved by selecting the concentration of the stabilizers in the mixed target.

During the process, the oxygen pressure can thus be considered as a free parameter with respect to the layer composition and adjusted. On the other hand, different experiments have shown that the oxygen pressure or flow can surprisingly be regarded as determining factor of influence on the layer morphology. The inventors therefore invented a method that enables the layer composition to be chosen by choosing the concentration ratios of the mixed target and, essentially independently thereof, allows the layer morphology, such as for example the size of the crystallite or the question of the columnar growth, to be chosen by choosing the oxygen partial pressure. In this respect, it is additionally remarkable that this can occur at relatively moderate substrate temperatures.

In a variant embodiment, the oxygen partial pressure, which is at least essentially a free setting parameter in terms of achieving a cubic and/or tetragonal crystal structure, is used for determining the layer morphology.

In a further variant embodiment, which will be discussed in more detail further below, in addition to oxygen, nitrogen is used as the reactive gas.

In a second embodiment of the present invention, the mentioned aim is achieved by a method for producing a zirconia-based layer on a deposition substrate, wherein reactive spark deposition using pulsed spark current and/or the application of a magnetic field that is perpendicular to the spark target are employed, wherein a zirconium target comprising elemental zirconium is used and wherein in addition to oxygen, nitrogen is used as the reactive gas.

In a variant of this embodiment, the layer is thereby produced in a cubic and/or tetragonal crystal structure.

According to this second embodiment of the present invention, it is possible to forgo using classical stabilizers if as a second inventive measure nitrogen is added to the reactive gas. Accordingly, an elemental zirconium target can be used as target. Without these further measures, i.e. without nitrogen, monoclinic zirconia layers would be deposited on the substrates in the course of the spark evaporation. As was surprisingly revealed, in certain pressure conditions and gas flows the use of nitrogen and oxygen as reactive gas will result in layers containing zircon, oxygen and nitrogen, which are present in cubic or tetragonal crystal structure. The pressure ratios and gas flow ratios can thus be chosen so that X-ray diffraction spectra of the corresponding layers will have clear reflections of the cubic crystallized $ZrO_2$.

In a variant of this embodiment, by thus setting the pressure ratios during the spark evaporation process a layer is generated containing zircon, oxygen and nitrogen, with cubic and/or tetragonal crystal structure.

In this method, the oxygen proportion is preferably set through a gas flow control device whilst the proportion of nitrogen is chosen according to a total pressure control device. In a coating according to this second inventive embodiment, it has been shown that, on the basis of cubic crystallized layers containing zircon, nitrogen and oxygen, pure $ZrO_2$ layers, i.e. completely without stabilizers, can be coated that are admittedly thin but are present in cubic crystal structure.

In a variant of this embodiment, the zirconia-based layer is thus deposited as a pure $ZrO_2$ layer in cubic crystal structure on a cubic crystallized layer containing zircon, nitrogen and oxygen.

The fact that thick pure $ZrO_2$ layers, i.e. without nitrogen proportion, finally reverts again to the soft monoclinic phase, can advantageously be used for some applications, which for example require a friction-reducing run-in, and is also an integral part of the present invention. One use of this variant is thus the production of a layer that can revert to the monoclinic phase, preferably for friction-reducing run-in.

As previously indicated, according to a third embodiment of the present invention the second inventive embodiment, i.e. the use of nitrogen as additional reactive gas, and the first inventive embodiment, i.e. the use of a zirconium mixed target containing a classical stabilizer, are executed in combination. This enables the production of cubic and/or tetragonal zirconia layers with a lower stabilizer concentration as otherwise usual. By comparison to the described second embodiment, due to the presence of possibly lower concentration of classical stabilizer, the oxygen gas flow and thus the morphology of the deposited layer can largely be adjusted in a specific manner.

The invention will now be described by way of example in detail and on the basis of the following reproductions, tables and figures.

To start with, one of the possible applications will be discussed in more detail in order to establish which requirements a corresponding method and/or layer should preferably fulfill. The enumeration of the requirements is, in this respect, essentially not to be understood as cumulative, although it can of course be advantageous if simultaneously several or even all of these characteristics are fulfilled.

Subsequently, we will briefly address a particularity of the coating installation used for the examples of procedures that should preferably be achieved and that leads to particularly stable coating processes.

Following upon that, different coating processes will be listed by way of example.

Only after that will the layers thus produced be characterized.

A discussion and interpretation of the characteristics discovered will follow the characterization.

One topic in connection with the possibly also inventive use of the present invention relates to the production of a material in layer form that has a high oxygen ion conductivity and is particularly suited for solid electrolyte fuel cells.

A typical solid electrolyte fuel cell is for example described in S. C. Singhal, *Recent Progress in Zirconia-Based Fuel Cells for Power Generation*, Fifth International Conference on Science and Technology of Zirconia, Aug. 16-22, 1992, Melbourne, Australia. It emerges from this that the solid electrolyte layer itself must additionally be provided with porous electrodes (cathode on the air side, anode on the fuel side) and that it then further requires additional "dense" interconnects in order to make a complete fuel cell. The design of the fuel cell is thus based on a complete layer system that is subjected to intensive thermal temperature change stress. Use of the cell under these conditions makes huge demands in terms of stability of the total layer stack in order to avoid diffusion and as regards the stability of the layer structure. The chemical stability of the solid electrolyte and its crystalline structure are particularly important. This temperature stability involves in particular that no or only few phase transformations caused by temperature should occur in the solid electrolyte. The control resp. avoidance of diffusion processes within the cell, in order to overcome "aging symptoms" or loss of performance, is also important. The adaptation of the thermal expansion coefficient among the various layer materials that make up the cell are of great importance for the stability of the cell.

On the basis of these general considerations, the inventors arrived at the following concrete requirements placed upon a solid electrolyte layer and the total layer stack of the fuel cell and this thus gives rise to an inventive use of the method discussed so far for the production of a solid electrolyte layer in a fuel cell.

If a zirconia layer is used as solid electrolyte layer, it should preferably consist primarily of cubic and/or tetragonal $ZrO_2$ in order to avoid the phase transformation into a monoclinic structure.

When using classical stabilizers, their integration should preferably be without problem and the free choice of the classical stabilizers should not be limited by the production method.

Thus, for a variant of the inventive use of said method, the following applies: the stabilizer is chosen freely.

Layer composition as well as phase composition and also layer morphology should preferably be modifiable largely independently from one another by means of easily adjustable parameter of the production method.

Thus, for a variant of the inventive use of said method, the following applies: layer composition, phase composition and layer morphology are set at least essentially independently from one another by means of the adjustment of parameters of the vaporization process.

The layer morphology and the crystal structure of the layer should preferably be capable of being produced in a substrate temperature range between 200° C. and 700° C., so that they on the one hand are compatible with usual substrate materials and on the other hand the substrate temperature can be freely chosen so that the adaptation to the various expansion coefficients within the entire layer stack is possible, i.e. the substrate temperature should preferably be chosen such that the tension stress and the compressive stress of the individual layers at least partly compensate each other, for example in the middle of the operation range.

For the inventive method, in one variant embodiment, the deposition of the layer thus occurs at a substrate temperature between 200° C. and 700° C.

In a further variant of the inventive method, the layer is produced as a layer in a layer stack.

The layer morphology of the solid electrolyte layer should preferably be adjustable from dense morphology (glassy) to strongly columnar growth.

Thus, for a variant of the inventive use of said method, the following applies: the layer morphology can be adjusted from glass-like to columnar.

It should preferably be possible to synthetize the cubic resp. tetragonal phase of the $ZrO_2$ also without classical stabilizers, either for use as solid electrolyte or for use as growth substrate of the cubic resp. tetragonal phase for a YSZ with low proportion of classical stabilizers, for example for cost reasons for the classical stabilizers.

Thus, for a variant of the inventive use of said method, the following applies: the solid electrolyte layer is produced without stabilizer.

One use of said method is directed to the production of the layer as growth substrate for a YSZ.

It should preferably be possible to have simple gradient layers between the solid electrolyte layer and the electrodes on the one hand as well as between the interconnects on the other hand, without having to interrupt the coating process. This means in particular that gradients between metals and metal nitrides, metals and metal oxides as well as metal nitrides and metal oxides should preferably be achievable.

Thus, for a further variant of the inventive use of said method, the following applies: the layer is produced with a gradient of the layer material composition in the direction of its thickness dimension, the gradient is preferably as follows: from Zr to ZrN, then to ZrO, then to $ZrO_2$, wherein the morphology and phase can be chosen freely.

Multi-layer coatings produced by variation in the oxygen-nitrogen content, are deemed particularly important by the inventors.

In a variant embodiment of the inventive method, the layer is thus produced as multi-layer coating by varying the oxygen/nitrogen content.

In this connection, transitions between metal nitride and the various metal oxides play a particular role since in a material system both conductive as well as insulating layers can be produced and the phases are selectable, which is advantageous both for the mechanical as well as for the structural stability of the layer stack.

Preferably, it should be possible to freely form the interface/intermediary layer according to practically all materials.

As mentioned, it should preferably be possible to form all layers in a material system comprising zircon as metallic component: Zr to ZrN to ZrO to $ZrO_2$, whilst remaining free to chose the morphology and phase.

The forming of the cubic or tetragonal phase, by contrast to sintering, preferably occurs at a lower substrate temperature far removed from the thermal state of equilibrium.

This results in the variant of the inventive methods according to which the forming of the cubic or tetragonal phase occurs while not in the thermal state of equilibrium.

It can be an advantage if it is possible to combine the Zr—O layer system with other oxides that are for example adapted to the substrate.

The possibility of admixing other metal oxides and compounds can also be advantageous in order for example to increase the ion conductivity.

This consequently results in the variant of the inventive methods according to which oxides of other metals than zirconium are integrated into the layer material.

The crystallite size of the layer can preferably be adjusted, in particular in the nanometer range. This small crystallite size increases the ion transport along the grain boundaries by comparison with materials with larger grains and results in a lower dependence of the ion conductivity on the temperature.

This consequently results in an inventive use of the inventive methods for increasing the ion transport along the grain boundaries, wherein the crystallite size of the layer can preferably be set in the nanometer range.

The solid electrolyte layer systems can preferably be combined with for example porous protection layers over the solid electrolyte layer.

It should preferably be possible to increase the mechanical stability and to achieve a particular micro-structure by adding Al—O, Cr—O, Al—Cr—O or further mechanically stable materials.

As regards the production method, the following requirements are preferably fulfilled each time:

A method is preferably provided that replaces the high sintering temperatures with a process in which temperatures at the substrate between merely 200° C. and 700° C. are necessary.

A method is preferably provided that enables a problem-free bonding of several layers with different functionality to the solid electrolyte layer.

A method is preferably provided that converts material produced by powder-metallurgy into an intermetallic compound, vaporizes it reactively and condensates it as a layer onto the substrate.

A method is preferably provided that essentially affords independence from the size of the starting powder.

A method is preferably provided that can easily be transferred to other material systems.

A method is preferably provided that offers a better possibility for forming the interface than in plasma spraying.

A method is preferably provided in which there are no control problems by contrast to electron beam evaporation.

A method is preferably provided that uses low-cost technology, that leads to a reduction of the spatters as compared with plasma spraying and that allows a simple process extension to quaternary oxides.

A method is preferably provided that uses targets that can be produced for example with powder-metallurgy technology or plasma spraying methods having the compositions desired for the layer.

DETAILED DESCRIPTION

Figure 19A:
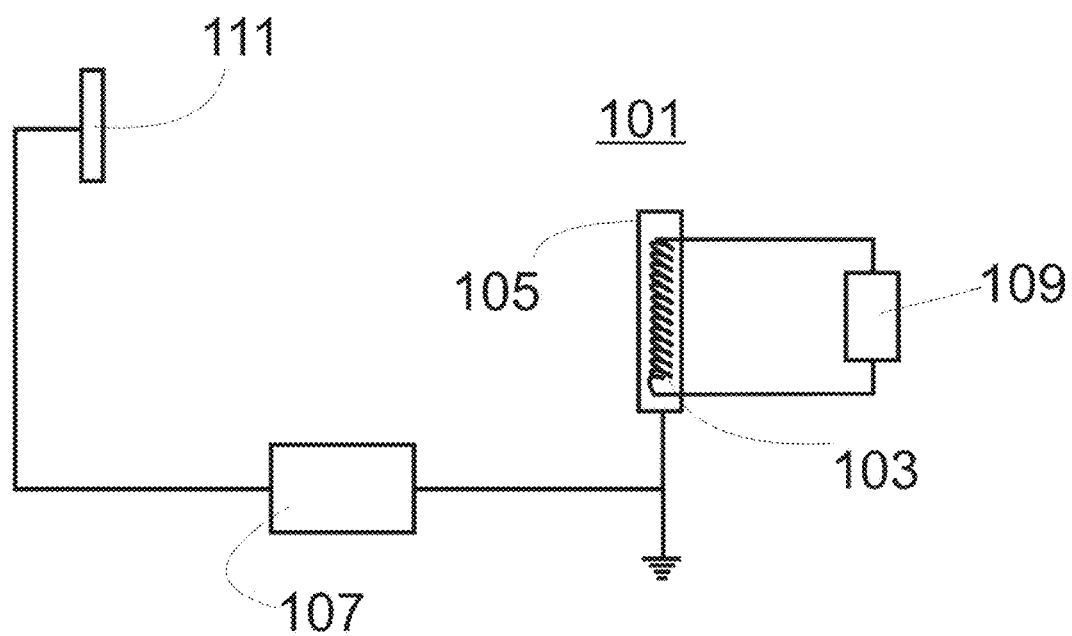
FIG. 19a shows a schematic diagram of a coating installation.
Figure 19B:
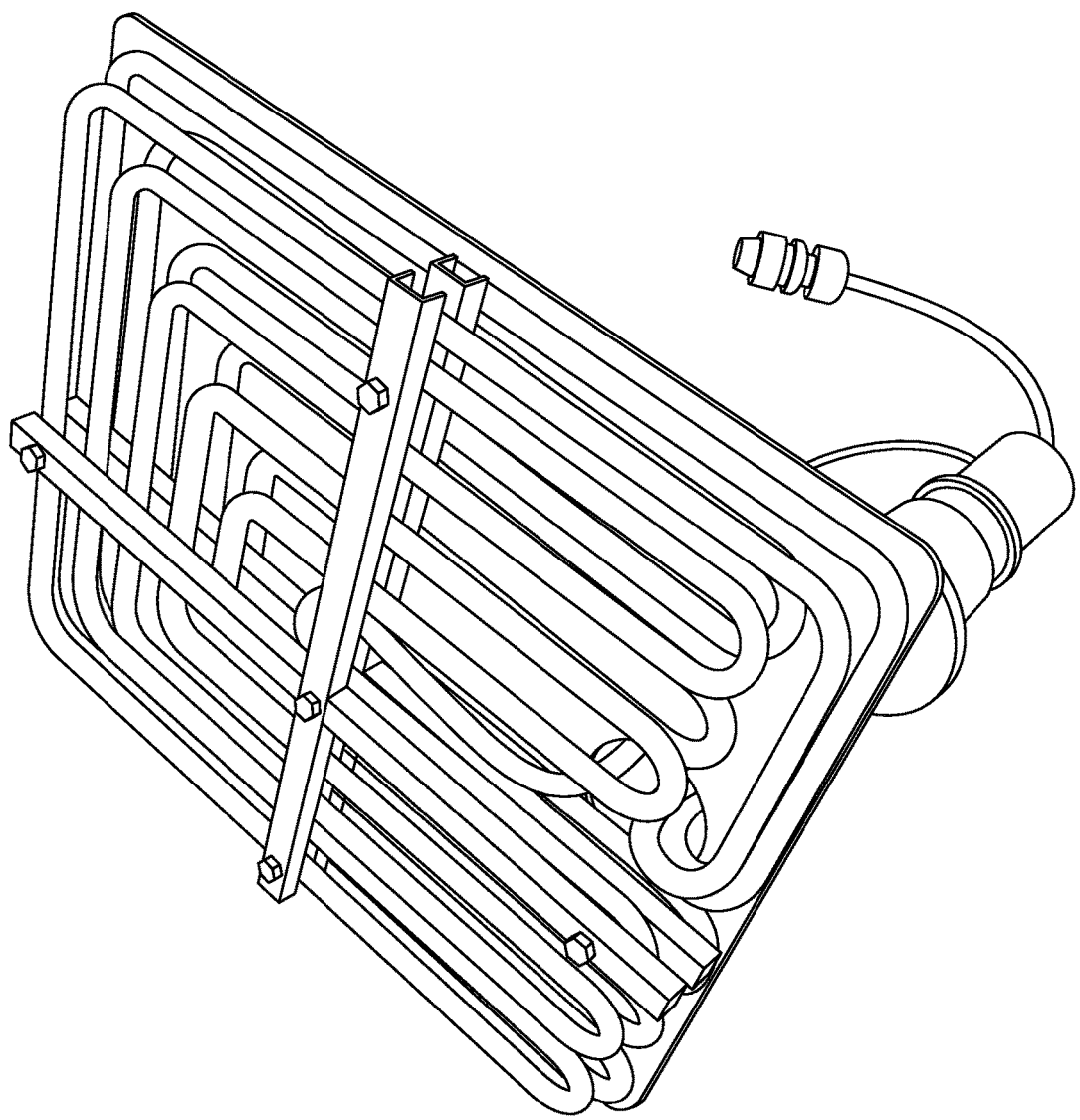
FIG. 19b shows an anode.

We will now address a particularity of the coating installation used for the following examples and that leads to a particularly stable coating process. In contrast to the methods that are described in the aforementioned patent documents and that relate in particular to the problem of the oxide coating at the target (cathode of the spark discharge) in pure oxygen flow processes, in the examples mentioned below a coating installation was used with specially designed anode and thus another problem of reactive spark evaporation is solved that is not directly linked with the production of zirconia layers. The one skilled in the art knows that not only the target but also the anode of the spark discharge can be coated with an oxide layer in pure oxygen as reactive gas. In WO_2009/056173 A1, a special execution of the anode (hollow anode) has therefore been described that maintains the anode surface conductive even in conditions where the spark discharge is operated in pure oxygen as reactive gas. This results in already quite stable coating processes. In this description, however, an improved anode design will be disclosed that for many applications is easier to achieve in production and has much lower maintenance requirements. One embodiment of this anode 101 is represented in FIG. 19b. FIG. 19a shows the anode 101 diagrammatically as a component of a coating installation with a spark source 107 of the coating installation and spark cathode 111. The anode 101 includes a heating coil 103 that is fed with an additional electric supply 109. The heating coil 103 of the anode 101 is insulated electrically from the shell 105 that can either be connected to earth or be operated floatingly and at least partly serves as anode surface for the spark discharge.

In a further aspect of the invention, an anode for a spark evaporation source, in particular for executing the aforementioned methods in particular in their inventive applications, is proposed that includes:

an anode body with an anode surface,
a heating coil along the anode surface, insulated electrically from the anode body,
connections, insulated electrically from the anode body, for the heating coil.

As shown in FIG. 19b, the anode 101 is designed so that it is distorted during a temperature change in such a way that the oxide layers formed continually during the coating operation on the shell 105 constituting the surface of the anode will spall during a temperature change.

In a variant of the inventive anode, the anode body is formed of sheet material.

According to the invention, a spark evaporation installation is operated with such an anode so that the anode surface is subjected to a temperature change caused by means of activation/deactivation of the heating coil in order to at least partially clean it from an interference coating, leading to the distortion of the anode surface and the spalling of the interference coating.

By inducing a temperature change, it is thus possible to guarantee an anode surface that is continually freed and conductive. In the coating installation, some of these self-cleaning anodes can be distributed so as to ensure a uniform coating. In a preferred embodiment, these anodes can be designed in such as way that they can also be used simultaneously as substrate heaters. In a further preferred variant, these anodes can be protected by shutters from direct coating by the spark sources.

The examples of procedures that follow and that will be discussed hereafter, were performed with this new anode arrangement, though their use is not compulsory for the production of the zirconia layers.

First, examples will be given for the synthesis of $ZrO_2$ layers comprising cubic resp. tetragonal phases, working with the source operation similar to US_20080020138 A1.

Spark sources of the company OC Oerlikon Balzers AG were used for the bonding substrate layers (SL) as well as for the function layers (FL) with targets having a target diameter of 160 mm and a thickness of 6 mm, used with a standard magnet system as described for example in US_20070000772_A1:

EXAMPLE 1

Step (A)

First the substrates onto which the layer or the layer system is to be applied are cleaned outside the coating system. This depends on the substrate material and its production method. Usually, wet chemical treatments, baking in specific gas atmospheres or other methods known to the one skilled in the art will be performed. In this case, a wet chemical treatment was carried out.

Step (B)

After placing the workpieces in the holding fixtures provided to this effect and placing the holders in the vacuum treatment installation, the treatment chamber is pumped out to a pressure of approx. 0.01 Pa.

Step (C)

Then, in a first vacuum pretreatment step, a low-voltage arc plasma assisted by radiant heaters is fired between a cathode chamber, separated by a screen, with a hot cathode, and the anodic connected workpieces in an argon-hydrogen atmosphere, wherein the process step is characterized by the following parameters:

Current of the low-voltage arc: 150 A
Argon flow: 50 sccm
Hydrogen flow: 300 sccm
Process pressure: 1.4 Pa
Substrate temperature: stabilized at approx. 500° C.
Process time: 45 minutes In this process step, the substrates are preferably connected as anode for the low-voltage arc.

Step (D)

In this process step, the etching of the substrates takes place, in order to achieve improved layer bonding to the substrate. For this, the low-voltage arc is operated between the filament and the auxiliary anode. Preferably, the workpieces are put under voltage with a negative bias voltage. Typical parameters for this step are:

Argon flow: 60 sccm
Process pressure: 2.4 Pa
Discharge current low-voltage arc: 150 A
Substrate temperature: approx. 500° C.
Process time: 30 minutes
Bias: 200 V (up to 1200 V for more intensive etching effects)

Step (E1)

Although the oxide can be deposited directly onto the substrate, a layer sequence will be described here that is particularly suited for binding oxides onto metallic substrates and that first uses an intermediary layer or protection layer (SL) before the function layer (FL) itself is deposited. This consists in depositing a first layer of ZrN onto the substrate.

There thus results a variant of the inventive method, wherein the deposition substrate has a metallic surface, to the effect that a supporting layer is deposited onto the metallic surface, then the layer on the supporting layer, wherein the supporting layer preferably consists of a metal except for Zr, of a nitride or of an oxide, preferably of ZrN.

The following parameters are used:

Operation of 4 elemental Zr targets (of course not limited to this number, an essential modification of the used target number must of course be reflected in an adjustment of the pressure resp. of the oxygen flows), each with 200 A spark current.

Total pressure control to 3.5 Pa, i.e. the intake of nitrogen must be regulated through the flow meter in such a manner than a total pressure of 3.5 Pa is always maintained in the coating chamber.

Substrate bias −60V (although ranges between −10 V and −1200 V are possible), bipolar pulsed with preferably 36 µs of negative and 4 µs positive pulse width, corresponding to a frequency of 25 kHz.

Substrate temperature: approx. 500° C.
Process time: approx. 5 minutes

Step (F1)

Figure 1A:
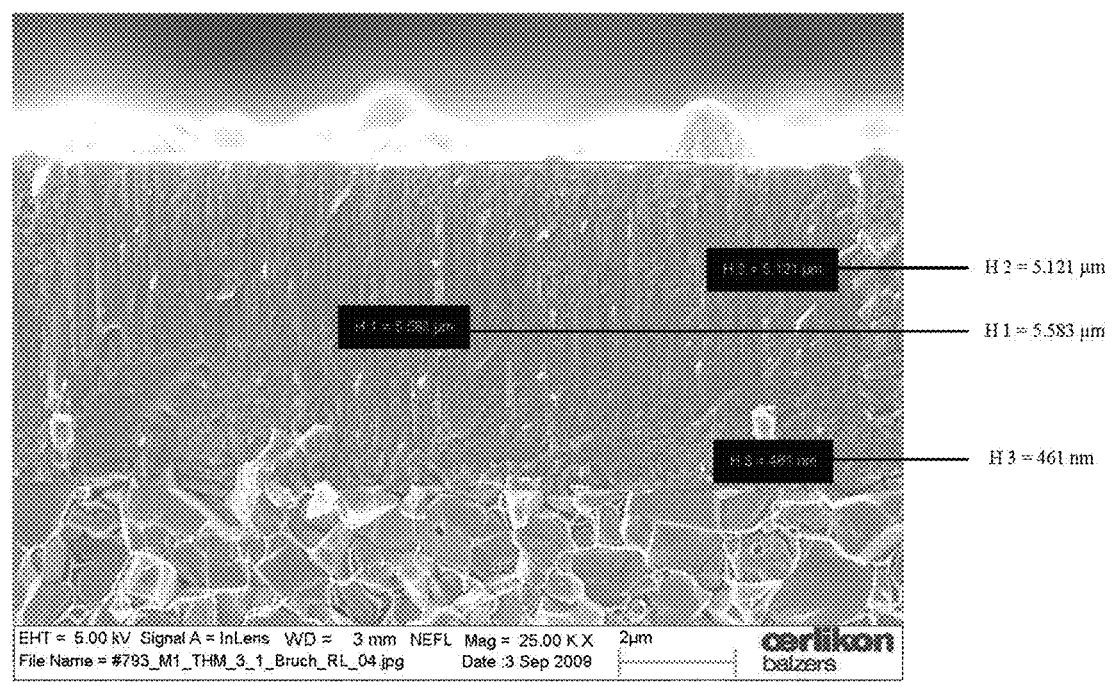
FIGS. 1a, 1b, 2, 3, 4a, 4b, 5a, 5b, 6a, and 6b show samples of rupture cross-section layers according to Example 1 as recorded in a SEM (scanning electron microscope)

In a further step, the transition to the function layer itself takes place by adding oxygen through the flow meter, with the following process parameters:

Oxygen intake: see below
Process pressure: 3.5 Pa (still with total pressure control)
Spark current: 200 A each for the 4 elemental Zr targets
Substrate bias: −40 V (bipolar)
Substrate temperature: approx. 500° C.
Process time: 40 minutes If, as described, 300 sccm oxygen is added, this yields a layer whose rupture cross-section as recorded in a SEM (scanning electron microscope) is reproduced in FIGS. 1*a* and *b* (see sample 793).

Figure 2:
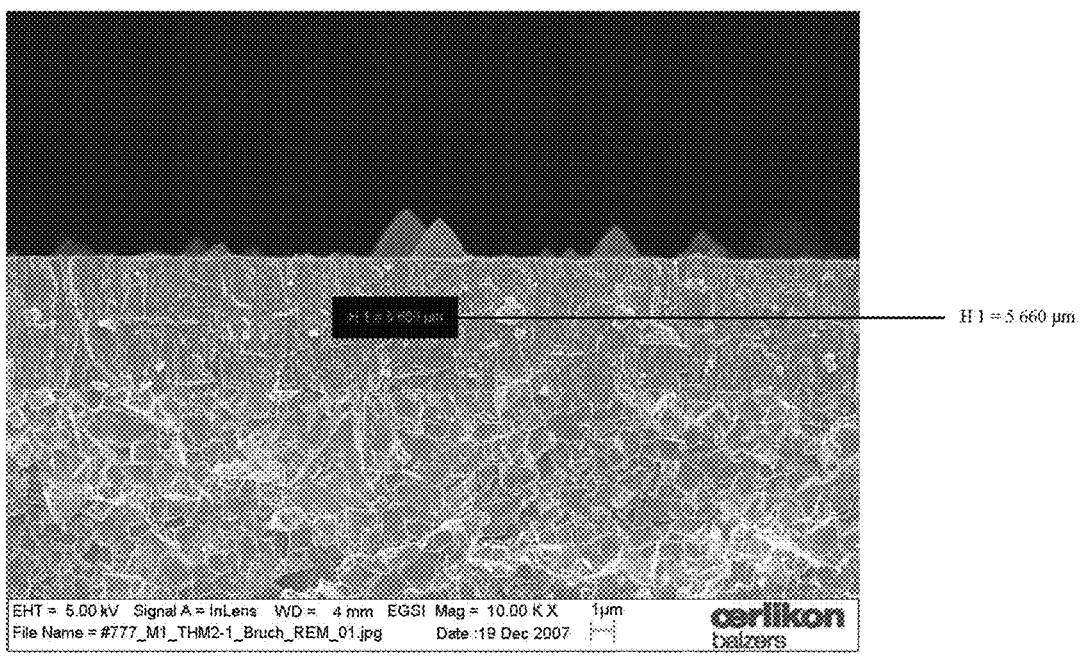
Figure 3:
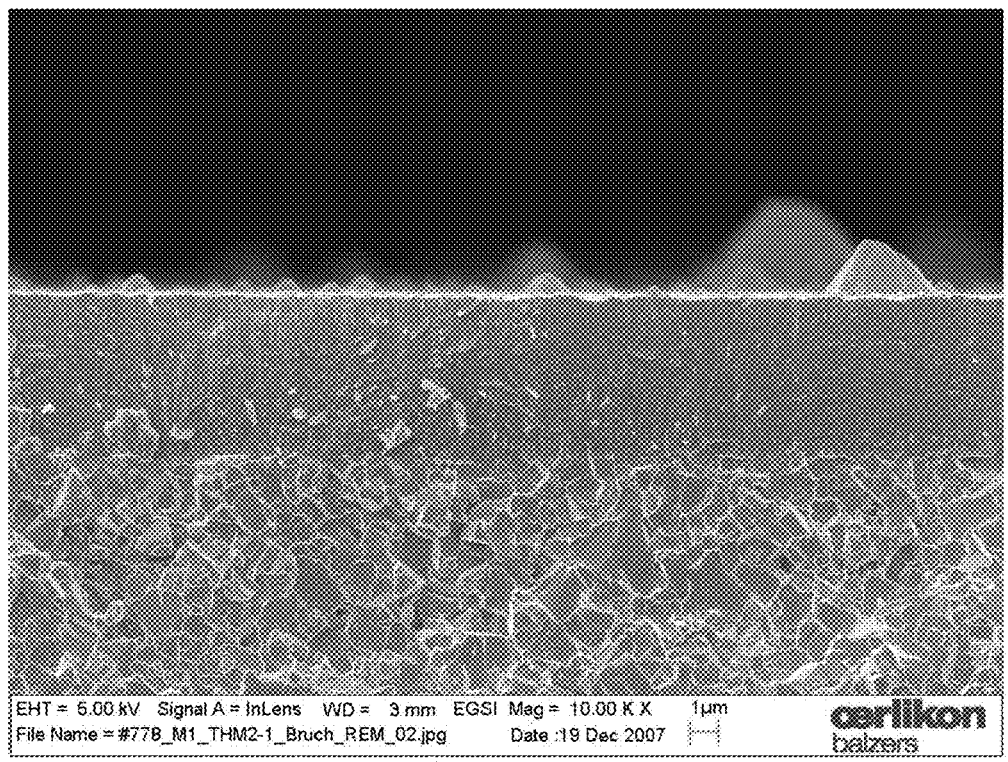
Figure 4A:
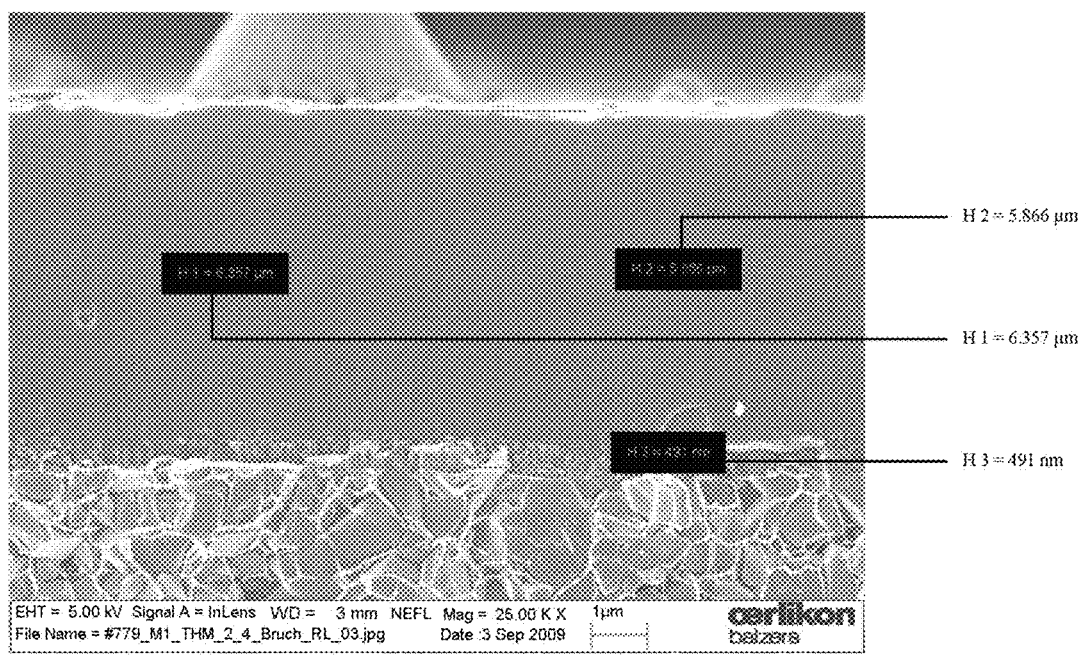
Figure 4B:
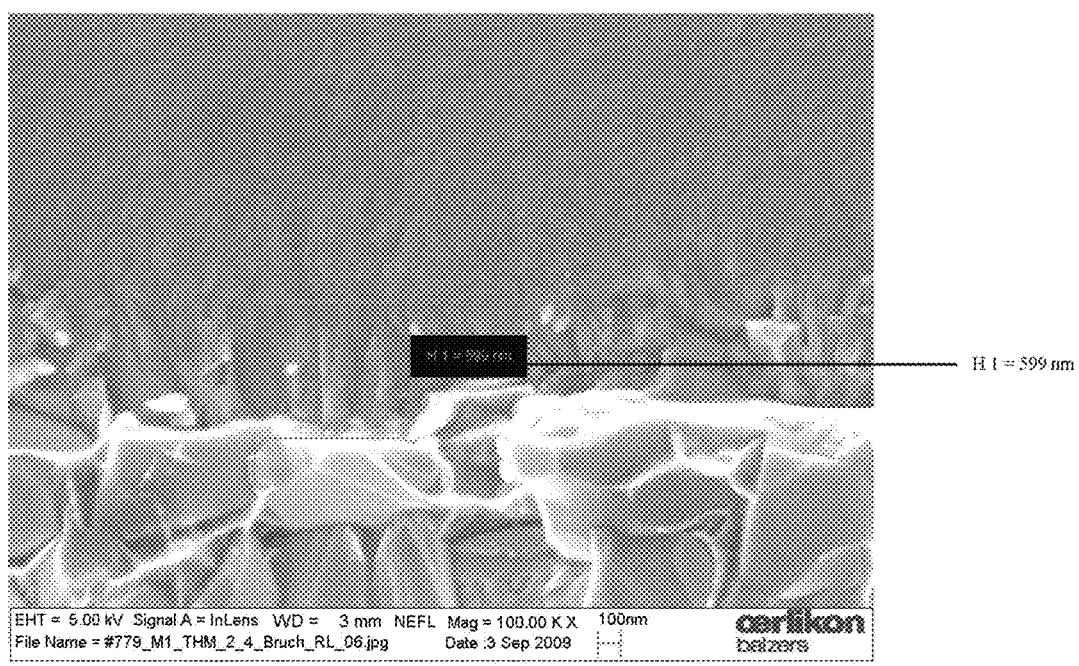
Figure 5A:
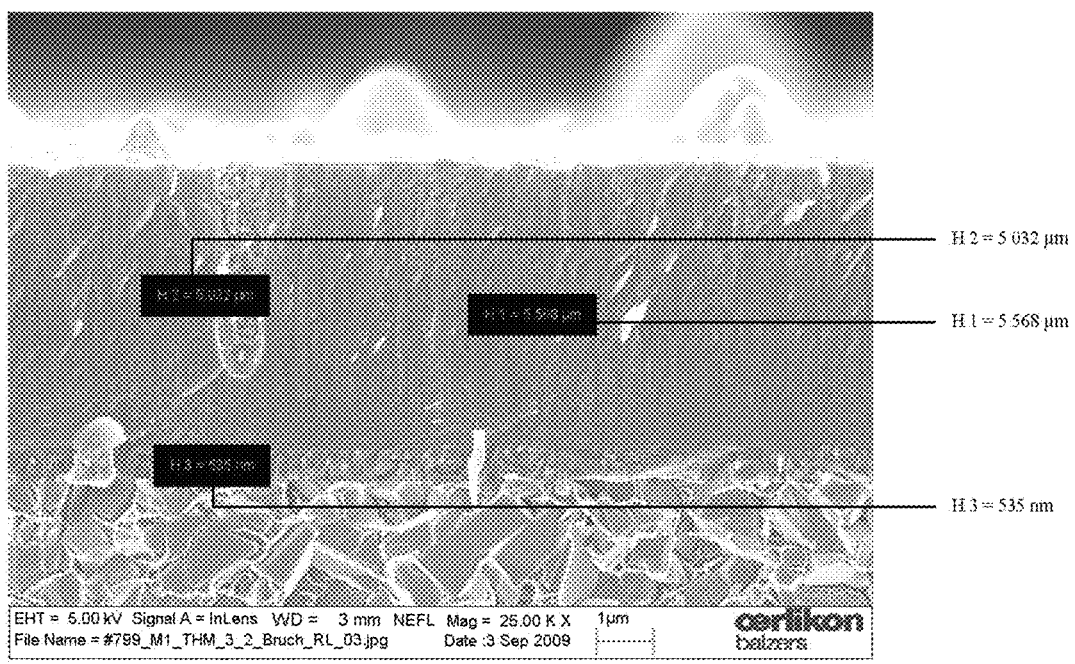
Figure 5B:
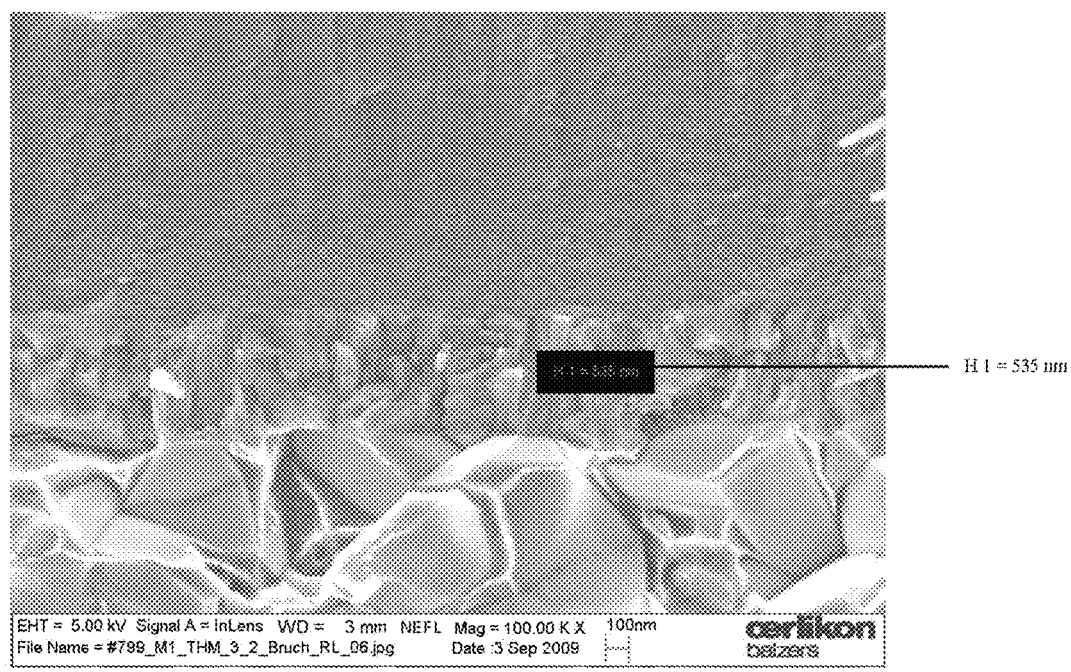
Figure 6A:
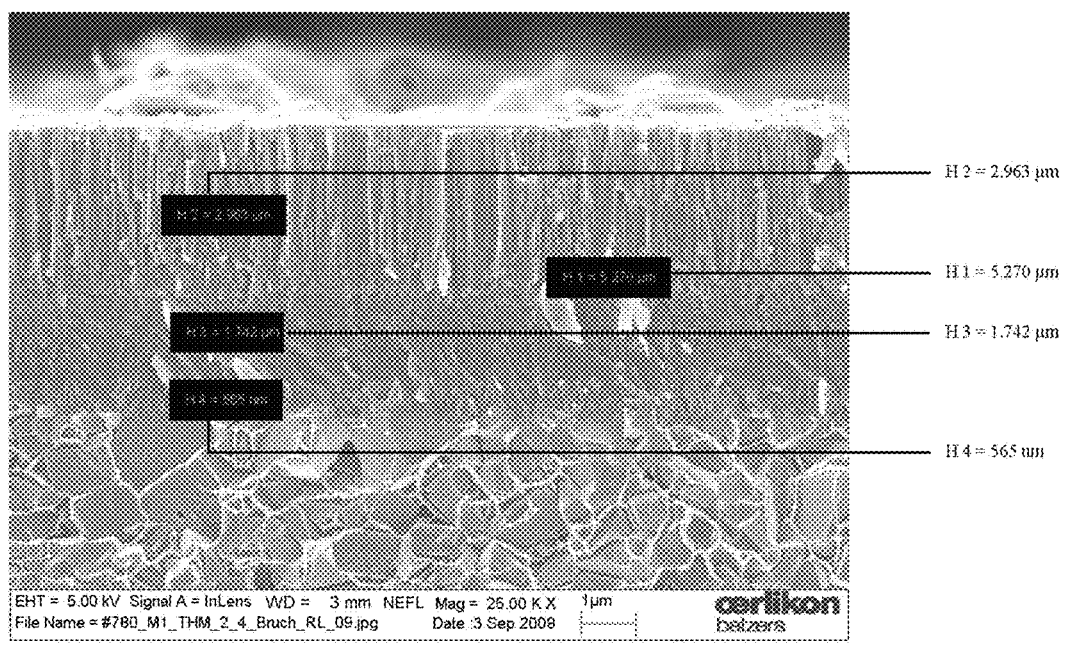
Figure 6B:
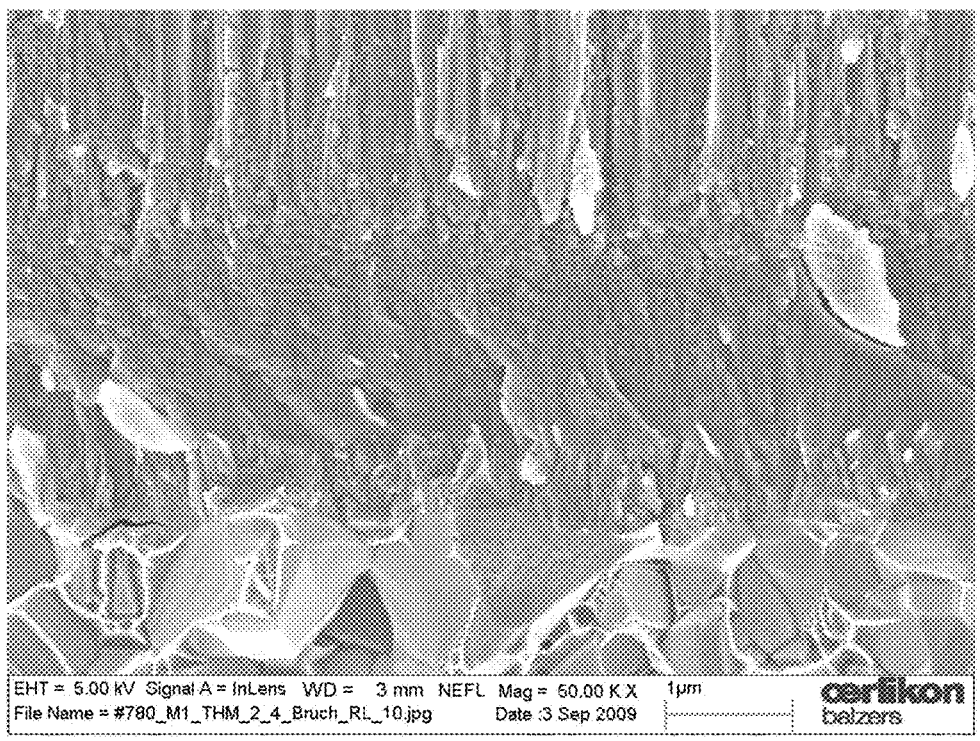

For oxygen intakes between 0 and 400 sccm, layers were produced in this manner that are described in table 1. The SEM pictures of the rupture cross-sections were also taken. The figures show the following samples:

FIG. 2: sample 777 (0 sccm O2)
FIG. 3: sample 778 (50 sccm O2)
FIGS. 4*a* and 4*b*: sample 779 (200 sccm O2)
FIGS. 5*a* and 5*b*: sample 799 (250 sccm O2)
FIGS. 6*a* and 6*b*: sample 780 (400 sccm O2)

The process described in example 1 is based on the use of "pure", i.e. elemental Zr spark targets without classical stabilizer, operated in a pure reactive gas atmosphere, i.e. without argon but each time either with N2 for the production of Zr—N or with oxygen for the production of Zr—O. In the layer transitions, a nitrogen-oxygen gas mixture is worked with. The process takes place under total pressure control, i.e. that the adjunction of oxygen means simultaneous withdrawal of nitrogen. In reality, this means that, with oxygen flows up to approx. 1000 sccm, there will still be portions of nitrogen atmosphere in the processing chamber. In the example, nitrogen was used as decreasing reactive gas adjunction. The use of exclusive oxygen demonstrably results, as from a certain layer thickness, in undesired monoclinic phase at about 350 sccm adjunction of oxygen.

EXAMPLE 2

In a further variant of process, layers are now to be produced in which alloy targets produced by powder-metallurgy (in the example each time 2 units) with a composition of 85 at % and 15 at % yttrium (Y) as classical stabilizer for the synthesis of the function layer (see also table 2) are used. For the production of the intermediary or supporting layer, 2 elemental Zr targets were again used:

First, the partial steps (A) to (D) were executed as described in example 1.

Figure 7A:
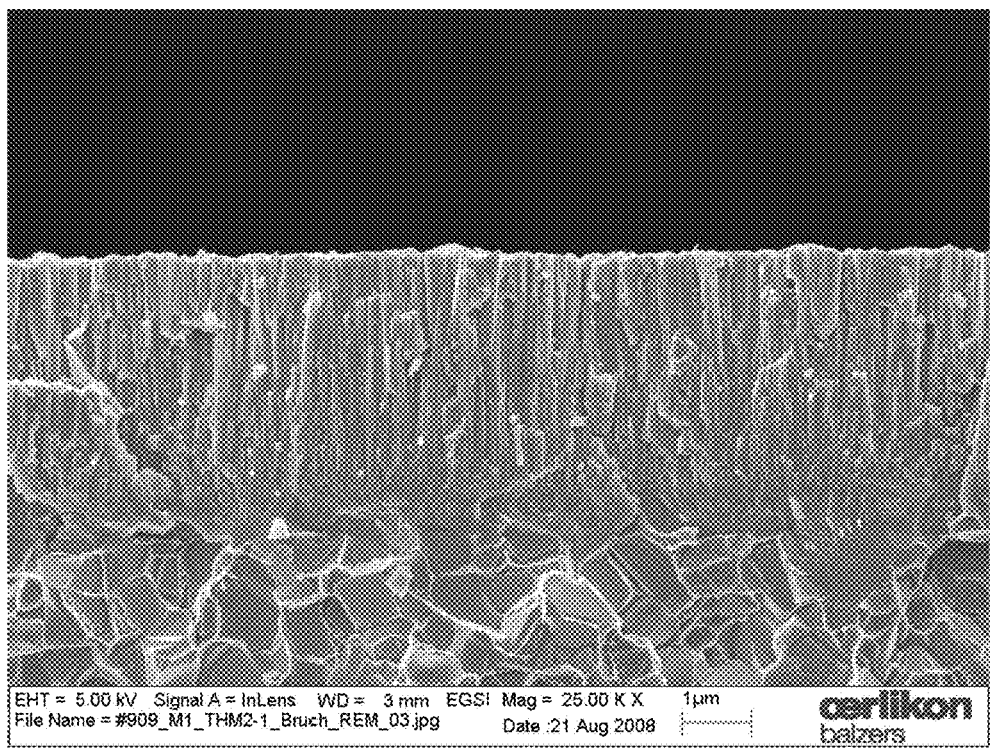
FIGS. 7a, 7b, 8a, 8b, 9a, 9b, 10a, and 10b show samples of rupture cross-section layers according to Example 2 as recorded in a SEM.

First, for the purposes of comparison, a layer without stabilizer is to be produced (steps E1 and F1). To this effect, the two Zr (85 at %)/Y(15 at %) targets were again replaced by two elemental Zr targets, i.e. 4 elemental Zr targets were operated in order to produce the intermediary layer.
Step (E2a)
  This took place with the following parameters:
  Total pressure (N2) set at 3.5 Pa
  Spark current 200 A per target
  Substrate temperature: approx. 500° C.
  Process time: approx. 5 minutes
Step (F2a)
  Then, a pure Zr—O layer (without Y) was deposited as layer, for which thus no Zr—Y targets were used, i.e. the 4 Zr targets continued to be operated and, as in example 1, merely oxygen with a flow of 350 sccm was added, i.e. working with the following process parameters:
  Oxygen intake: 350 sccm
  Total pressure (N2) set at 3.5 Pa
  Spark current: 200 A each for the 4 elemental Zr targets
  Substrate bias: -40 V (bipolar)
  Substrate temperature: approx. 500° C.
  Process time: 40 minutes The rupture cross-section of the layer thus achieved (sample 909) is represented in FIGS. 7a and b.

In further tests, layer systems with yttrium stabilizers are to be produced. For the further produced layers (910 to 912), the steps (E1) and (F1) were therefore modified as follows:
Step (E2b1)
  For this step, only 2 Zr targets are left in the coating installation and operated to produce the intermediary layer. This occurred with the following parameters:
  Total pressure (N2) set at 3.5 Pa
  Spark current: 200 A per target
  Substrate temperature: approx. 500° C.
  Process time: approx. 7 minutes
Step (E2b2)
  In this step, the transition to Zr—O—N is produced:
  Total pressure (N2) set at 3.5 Pa
  Spark current: 200 A per target
  Substrate temperature: approx. 500° C.
  Process time: approx. 3 minutes
  Oxygen ramp from 50 sccm to nominal flow (200 sccm, 300 sccm or 350 sccm depending on the sample, see table 2).
Step (E3b3)
  Operation of the two Zr(85 at %)/Y(15 at %) targets for 2 minutes with a spark current of 200 A. Subsequently immediate switching off of the elemental Zr targets.
Step (F2)
  Switching off of the two elemental Zr targets and execution of the coating with the two Zr(85 at %)/Y(15 at %) targets for a further 80 minutes and a nominal oxygen flow according to table 2.

Figure 8A:
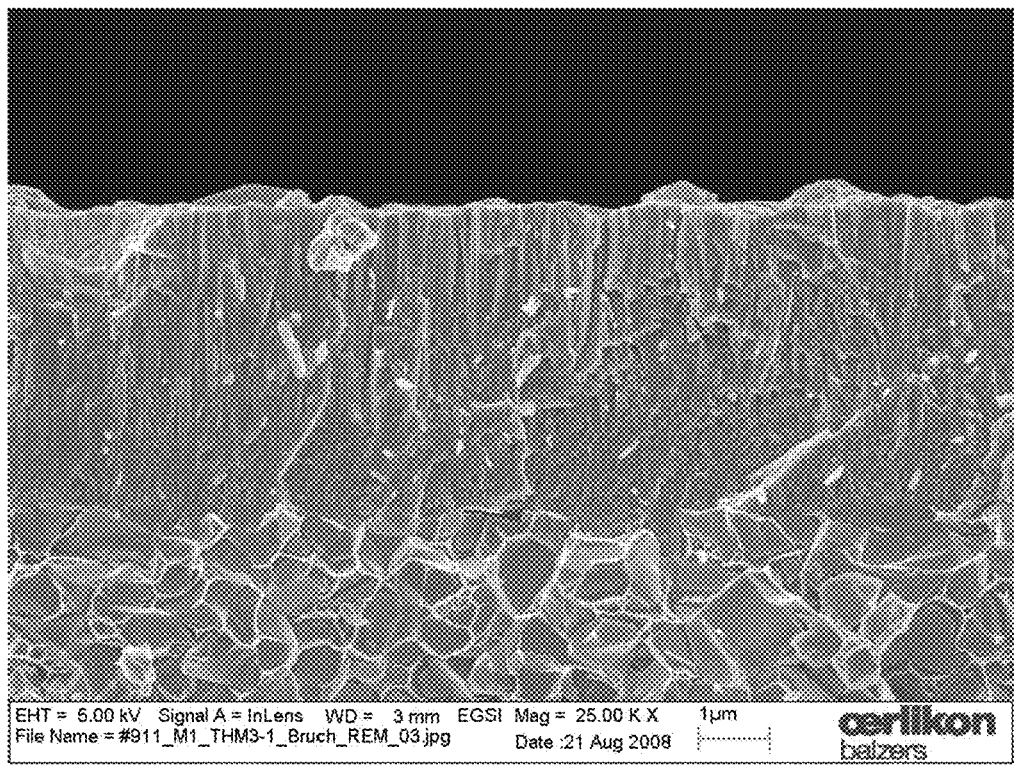
Figure 8B:
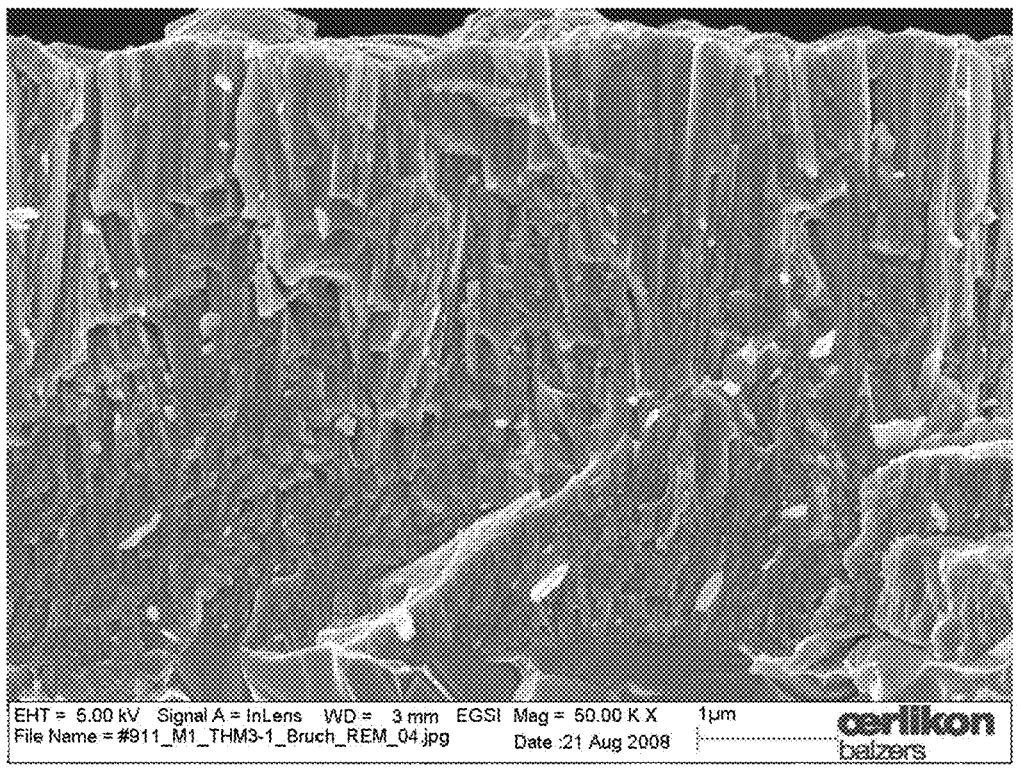
Figure 9A:
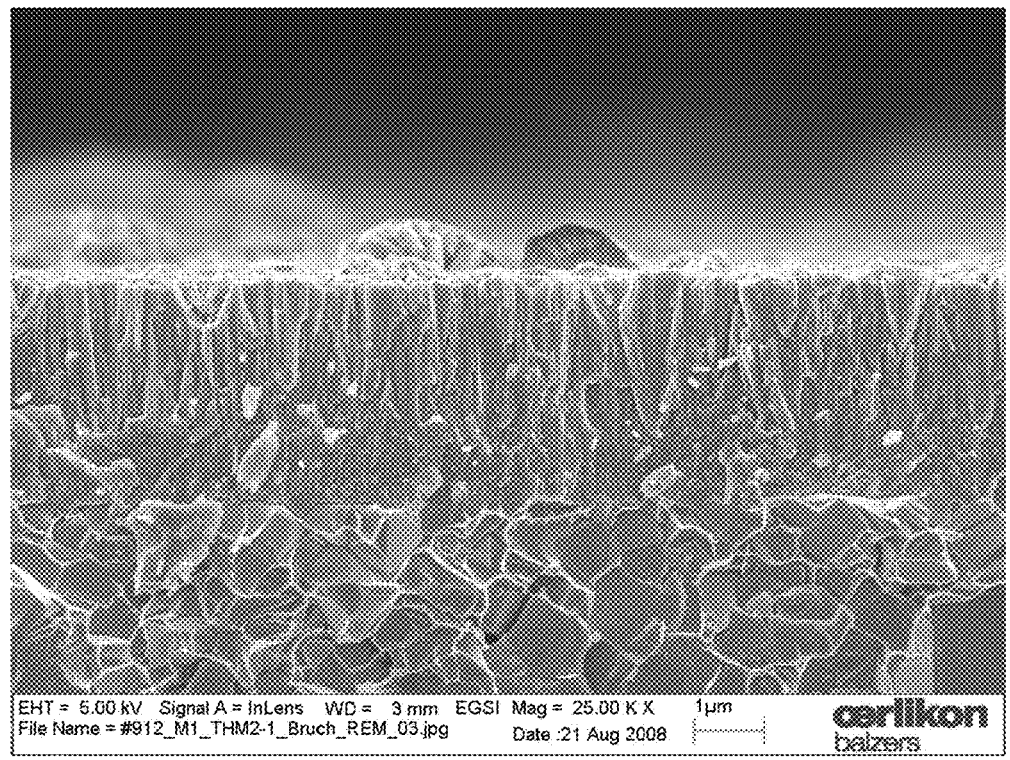
Figure 9B:
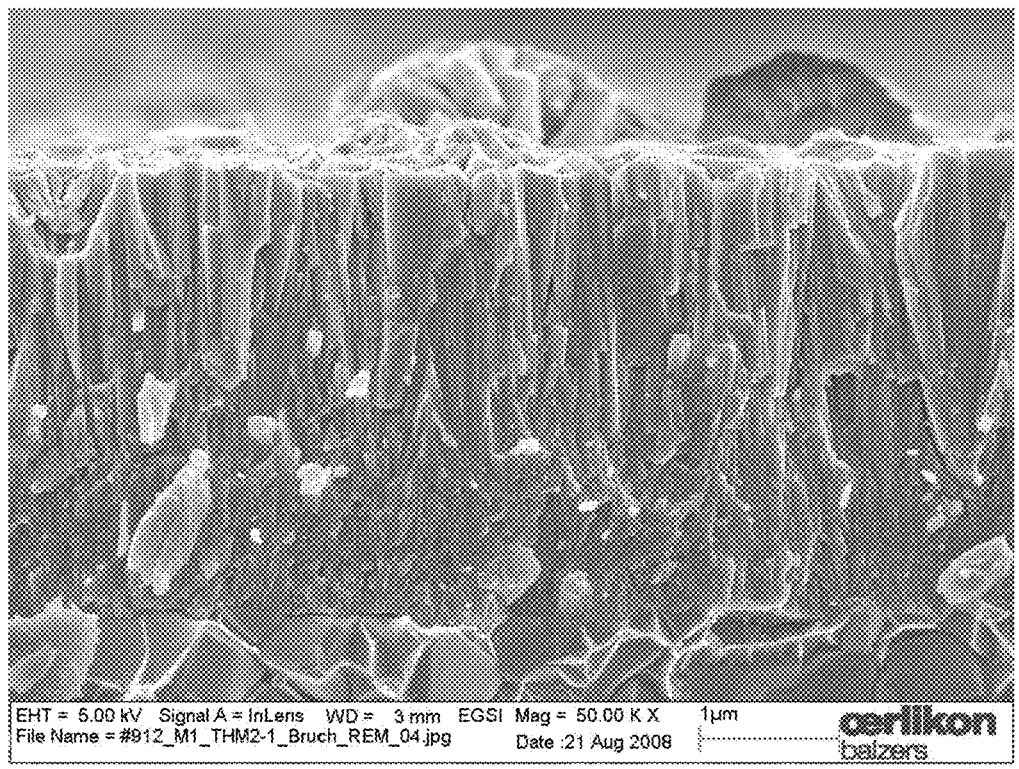
Figure 10A:
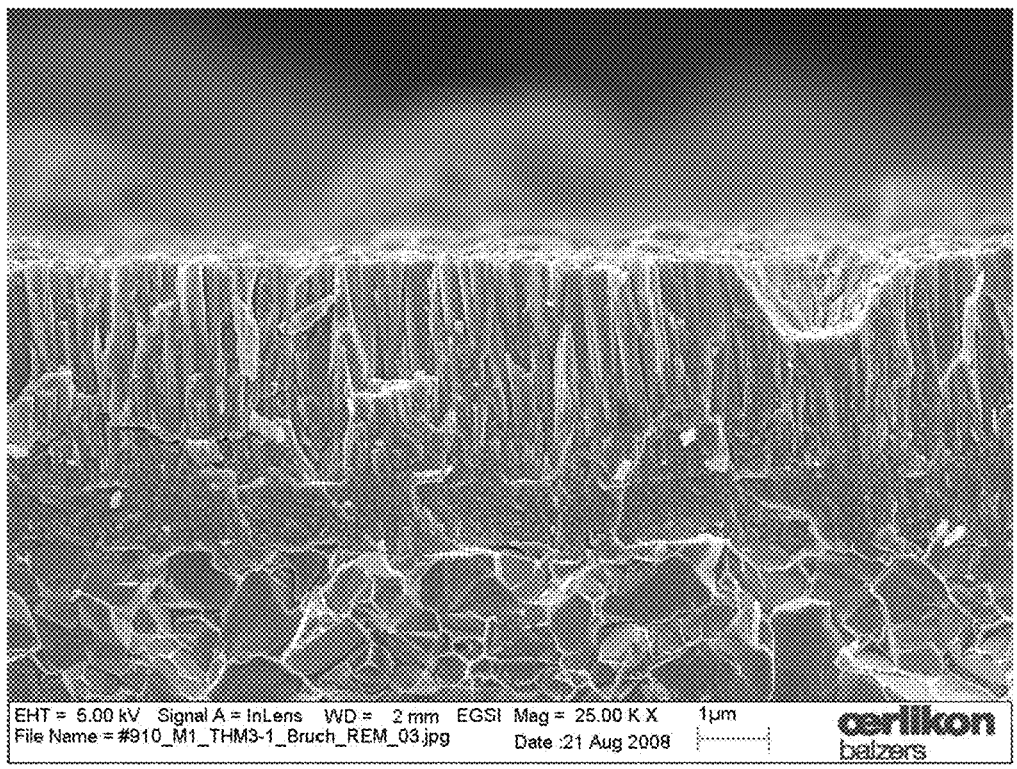

For the layers produced according to table 2 with oxygen flows between 200 and 350 sccm, the rupture cross-sections were again analyzed in the SEM. The figures show the following samples:
  FIGS. 8a and 8b: sample 911 (200 sccm O2)
  FIGS. 9a and 9b: sample 912 (300 sccm O2)
  FIG. 10a and b: sample 910 (350 sccm O2)

In further experiments, to be described as example 3, it was examined how a good bonding intermediary layer can be produced in layer systems that have been deposited even before the coating onto the substrate with cubic or tetragonal ZrO2 layers. These layer systems can thus be produced both outside the coating system, for example in another coating process, or also previously in the same coating system.

In this connection, a plurality of layers was examined that are typical for applications as metal electrodes, as thermal protection layers, as wear-protection layers and for sensor applications. By way of example, a few will be mentioned here: Al, Cr, Ti, Ta, Zr, TiN, ZrN, TiCN, TiAlN, the oxides of Al, Cr, Ti, Ta, Zr, ternary and quaternary oxides.

In this example 3, the formation of the intermediary layer on a TiCn layer will be discussed in more detail yet without limitation, with subsequent deposition of the Zr—O function layer.

In the tests, for the Zr—O function layer two alloy targets were used this time with the composition of Zr(92 at %)/Y(8 at %). The TiCN layer is a layer known to the one skilled in the art in the field of tool and component coating and its production can be assumed to be known to the one skilled in the art.

The bonding to the Zr—Y—O layer occurs in such a manner that shortly before the end of the TiCN layer, i.e. in the phase of the Ti spark evaporation in the reactive gas mixture of nitrogen and hydrocarbon (e.g. C2H2), which takes place with total pressure control, both Zr(92 at %)/Y(8 at %) targets are made operational. After a few minutes, the hydrocarbon gas is ramped down and then the Ti targets are switched to TiCN coating. Finally, again after a few minutes, oxygen is added and ramped to the necessary oxygen flow.

The layers produced in this manner are described in table 4. Layers were produced with oxygen flows between 200 sccm and 400 sccm. Rupture cross-sections were also taken from these samples and examined in the SEM.

Figure 11A:
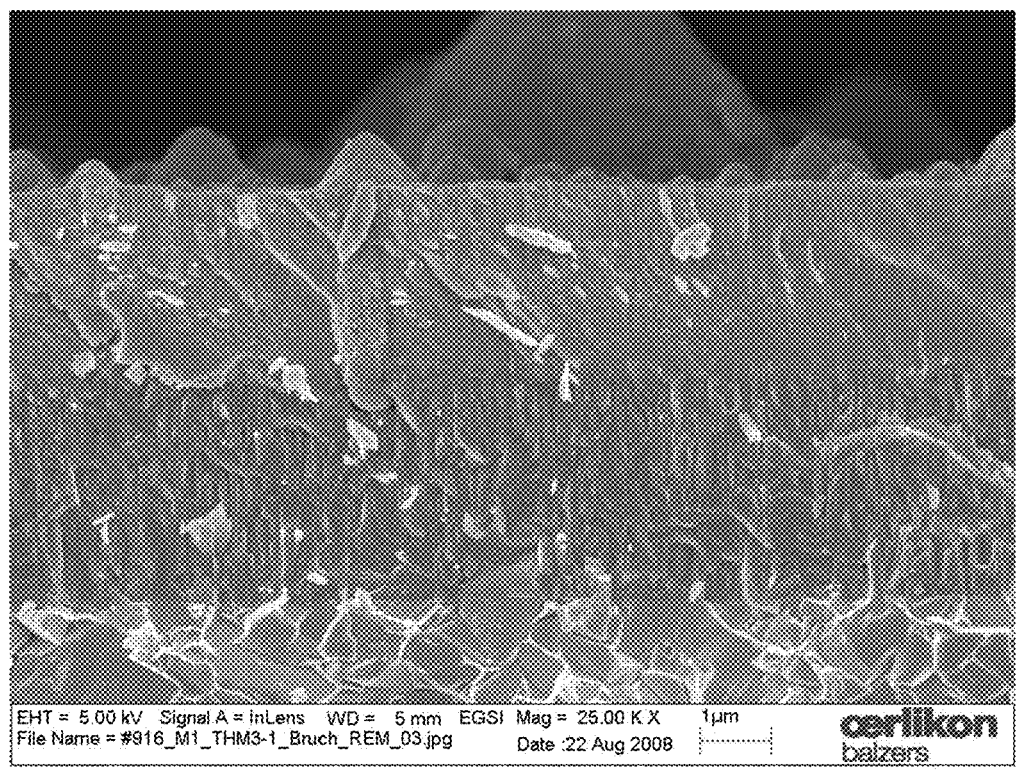
FIGS. 11a, 11b, 12a, 12b, 13a, 13b, 14a, and 14b show samples of rupture cross-section layers according to Example 3 as recorded in a SEM.
Figure 11B:
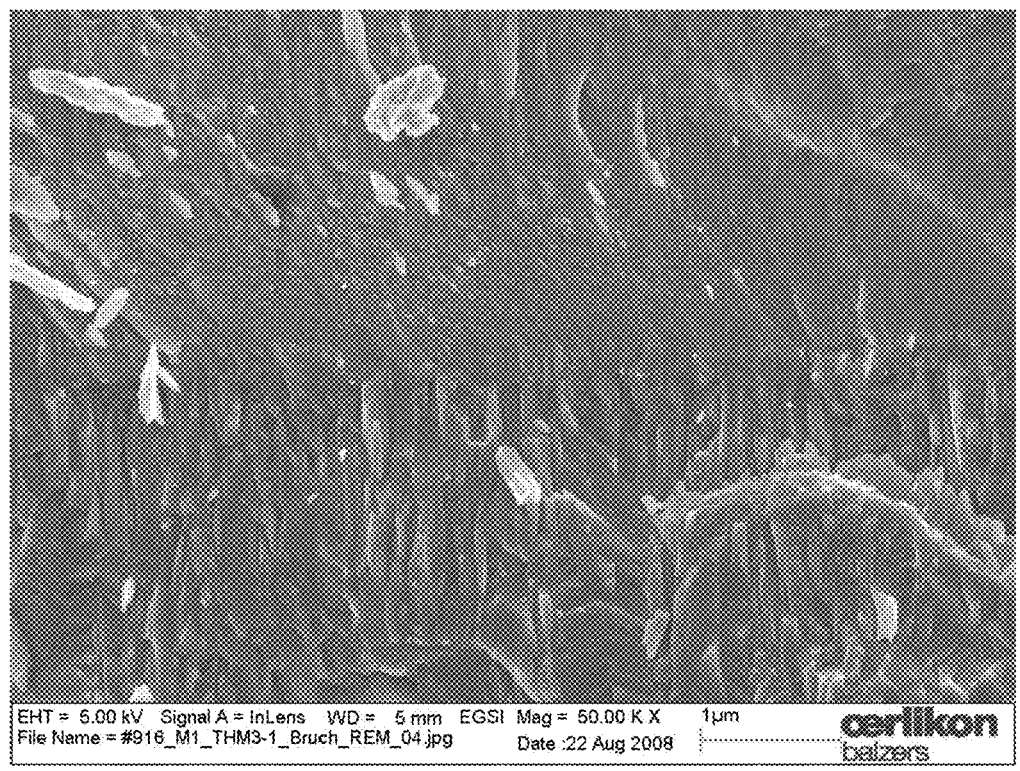
Figure 12A:
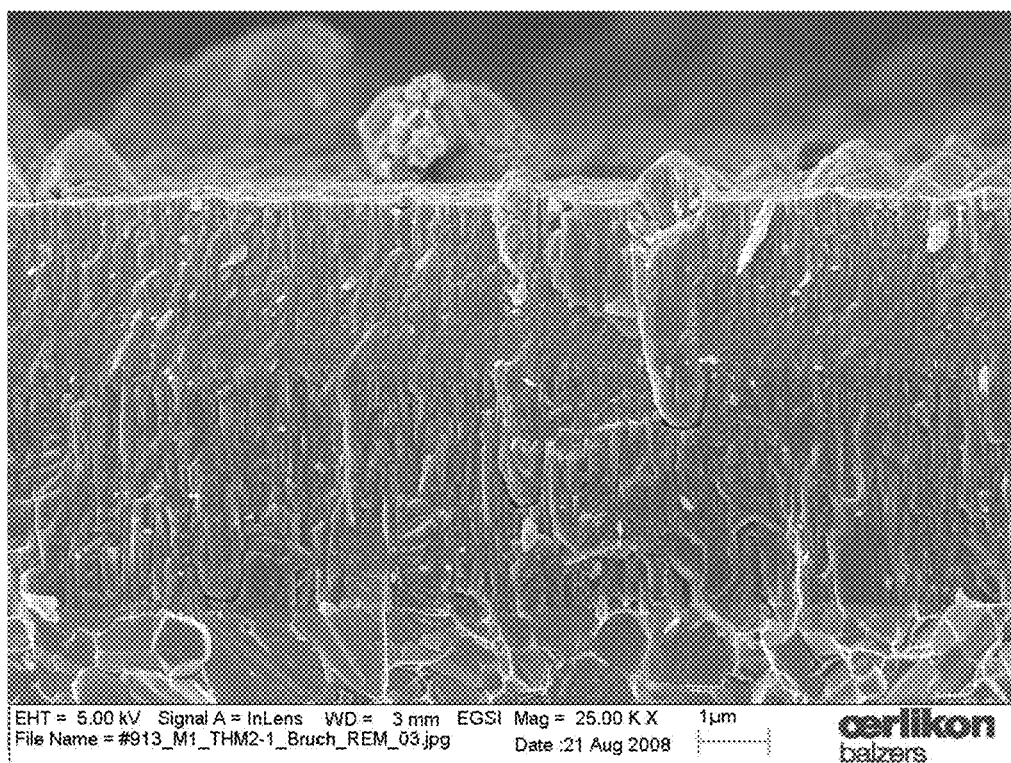
Figure 12B:
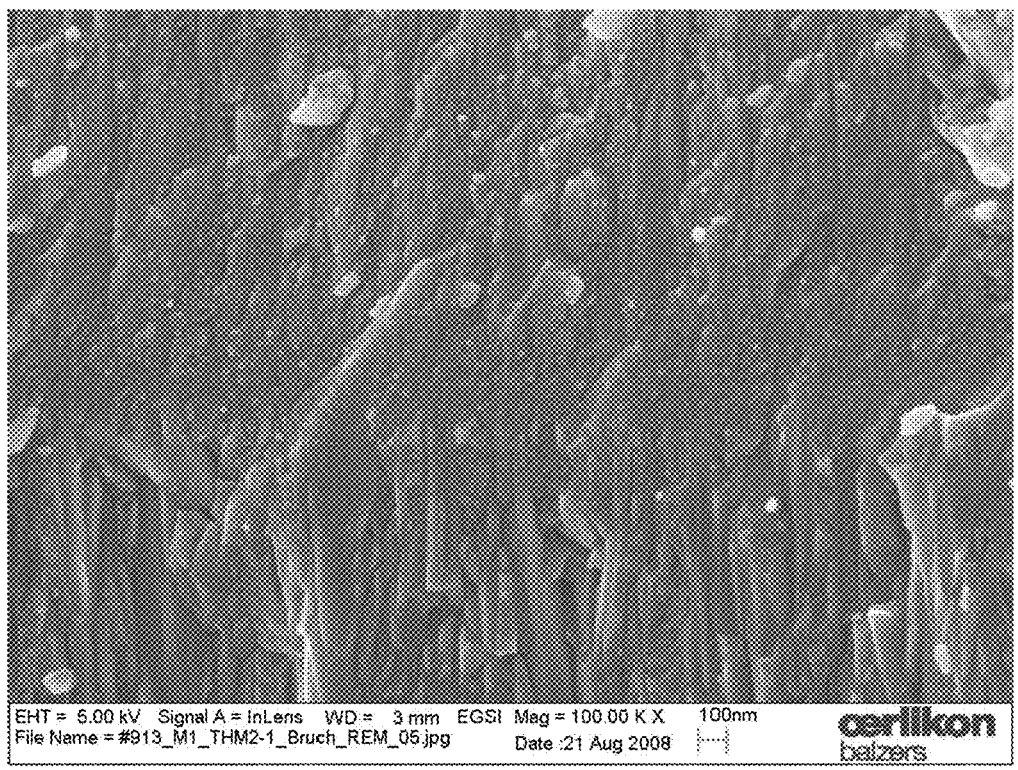
Figure 13A:
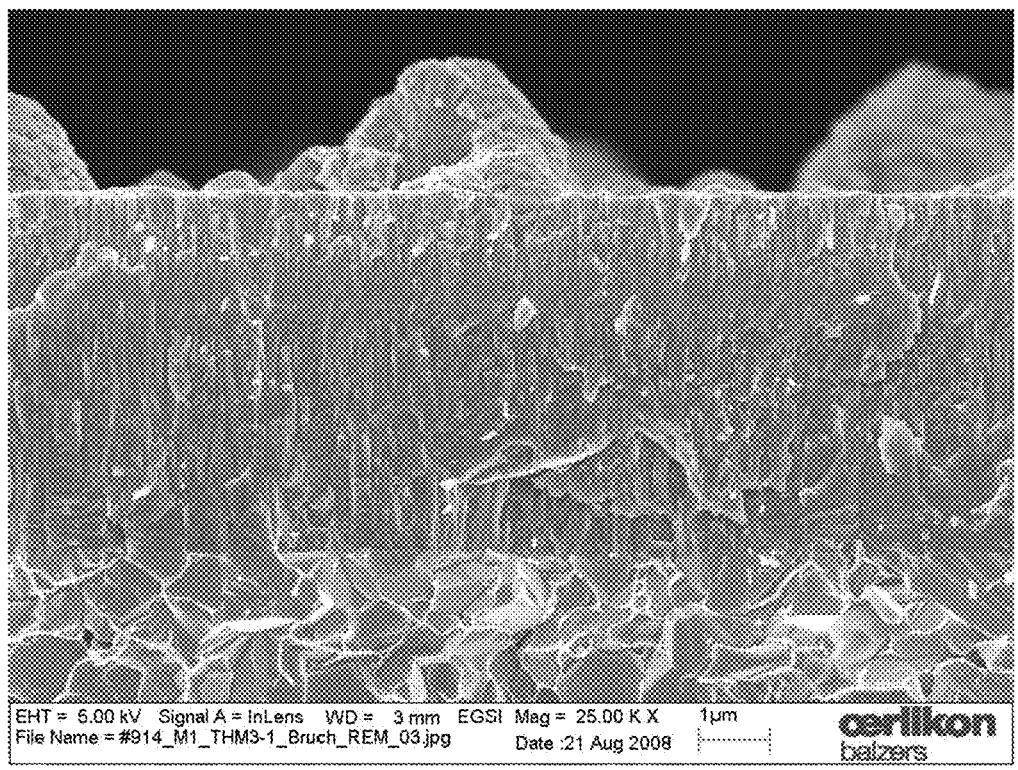
Figure 13B:
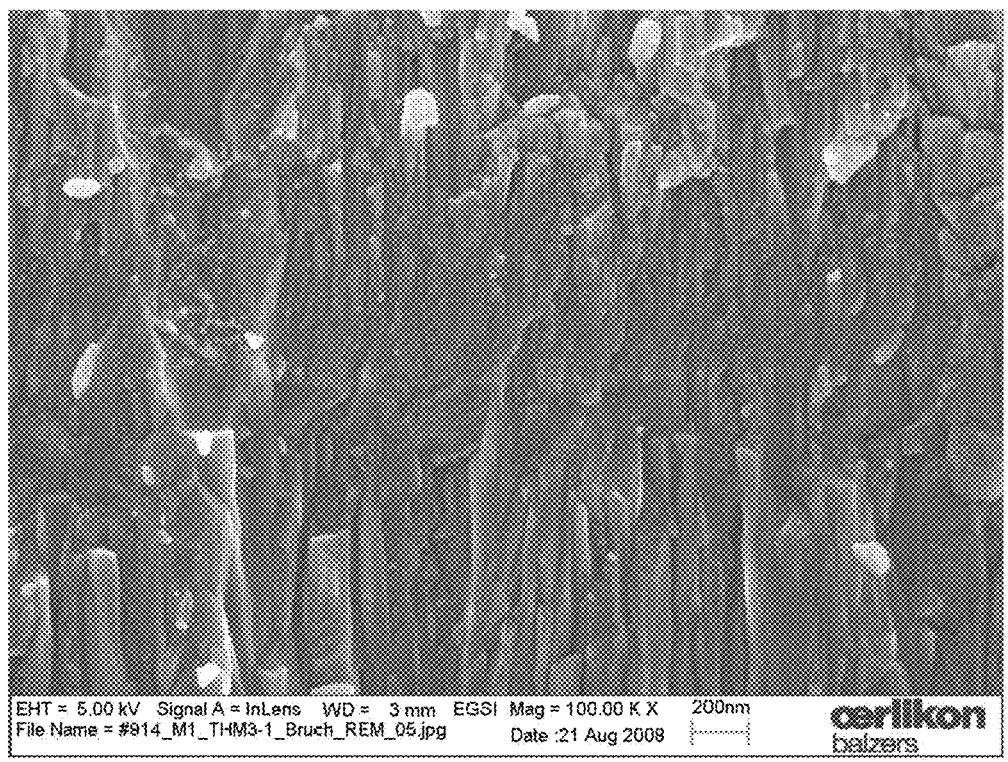
Figure 14A:
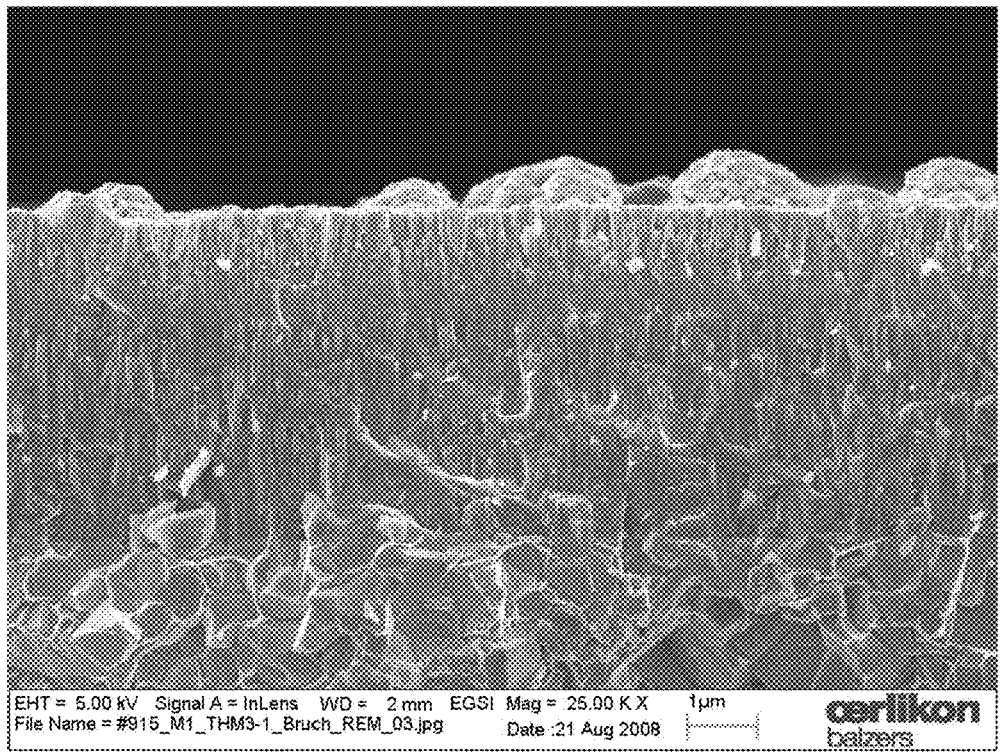
Figure 14B:
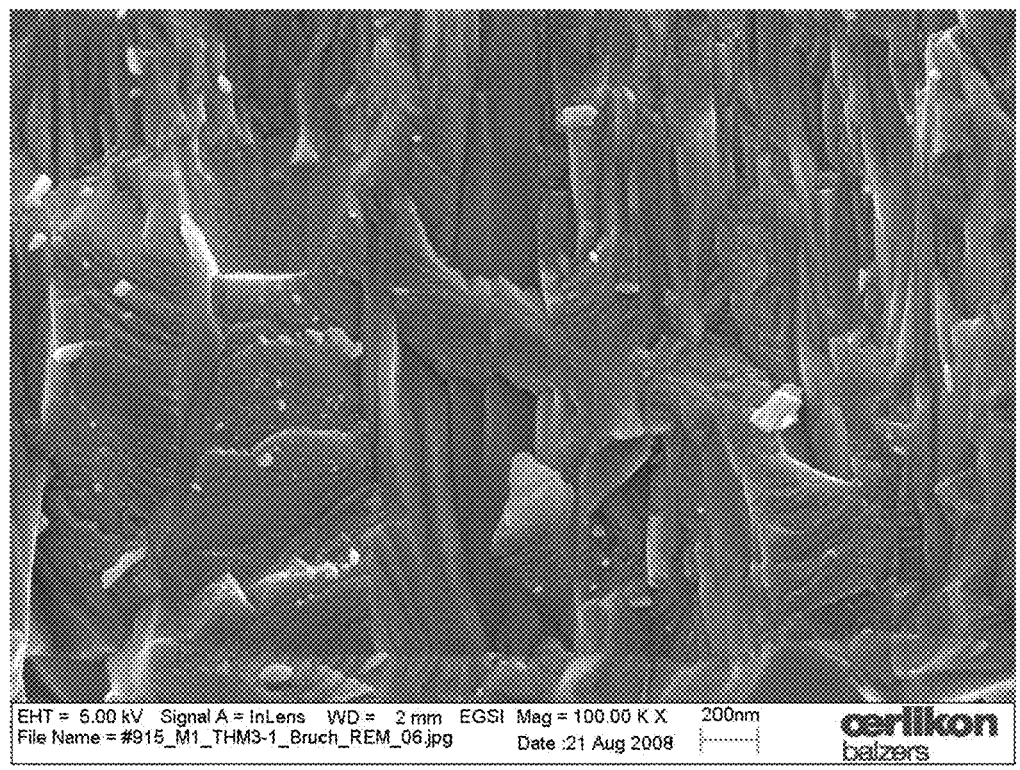

The figures show the following samples:
  FIG. 11a and b: sample 916 (200 sccm O2)
  FIG. 12a and b: sample 913 (250 sccm O2)
  FIG. 13a and b: sample 914 (350 sccm O2)
  FIG. 14a and b: sample 915 (400 sccm O2)

Further examples of layers will now be cited that have been produced on the basis of the examples described above, without however going into details of the process parameters for each layer. The examples of layers should merely document that with the production method, the Zr—O layers can be bonded without problem to other layer materials and further prove that the morphology and layer structure resp. their phase composition will easily be influenced with the proposed production method.

Figure 15A:
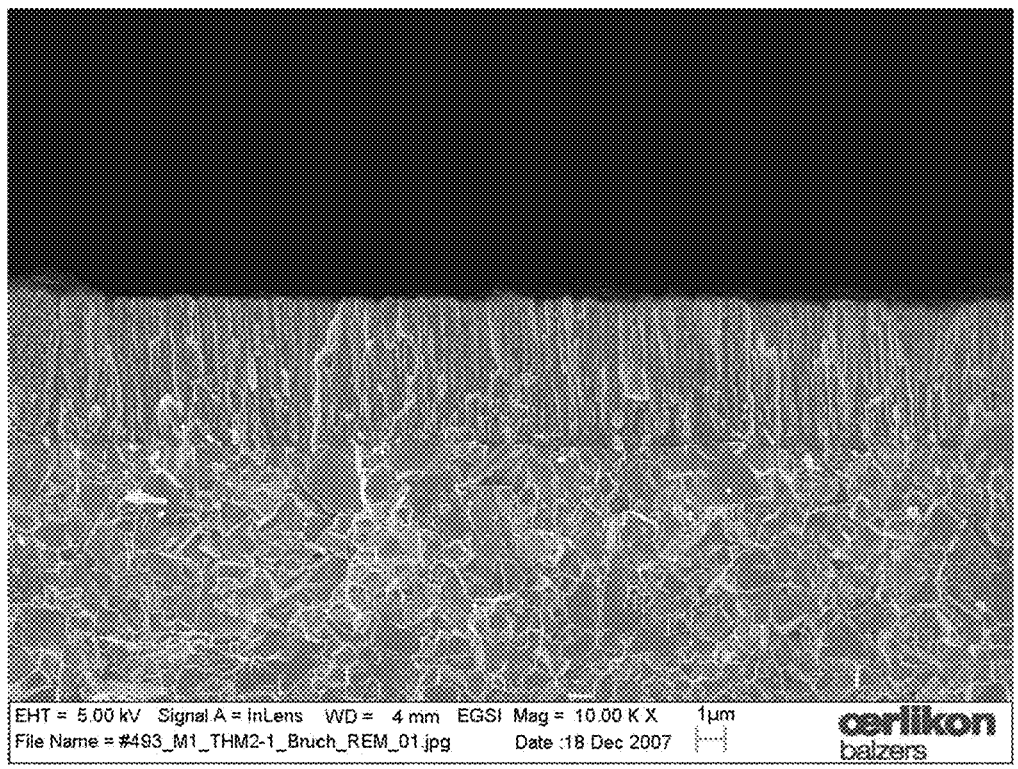
FIGS. 15a, 15b, 16a, 16b, 17a, 17b, 18a, and 18b show samples of rupture cross-section layers according to further examples as recorded in a SEM.
Figure 15B:
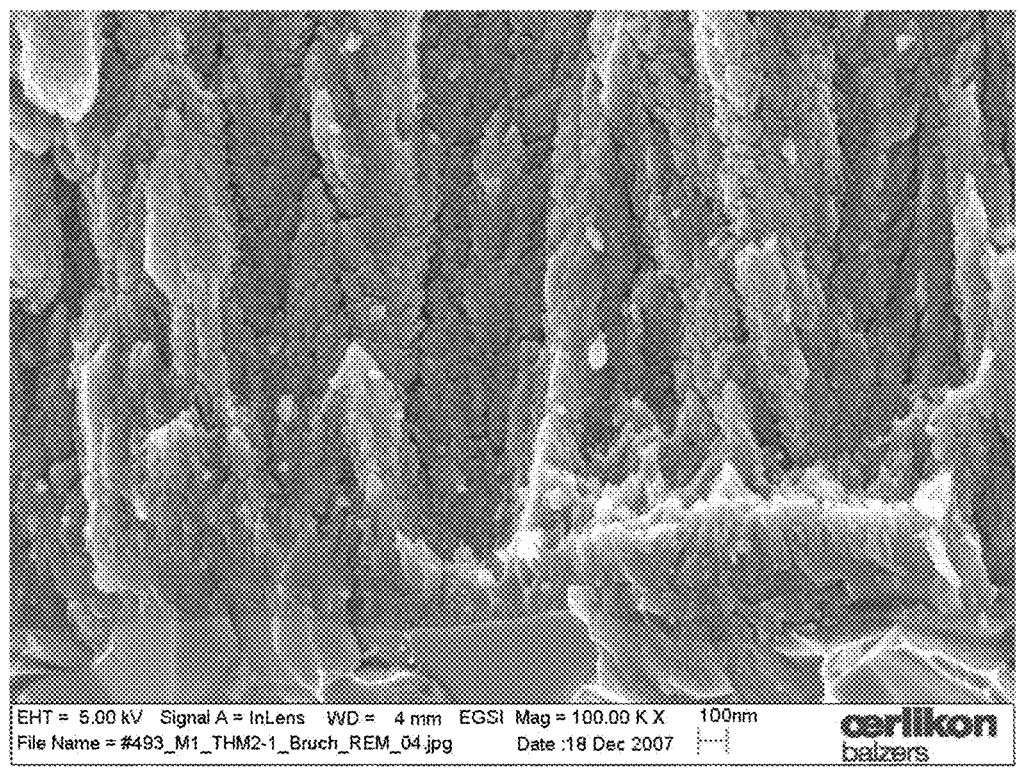
Figure 16A:
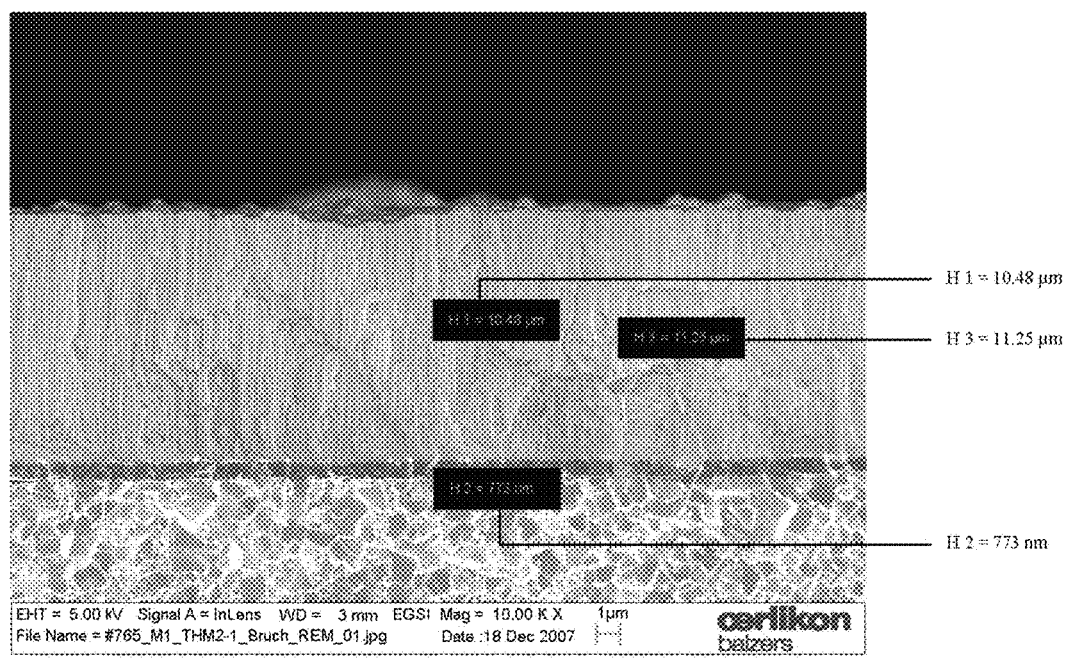
Figure 16B:
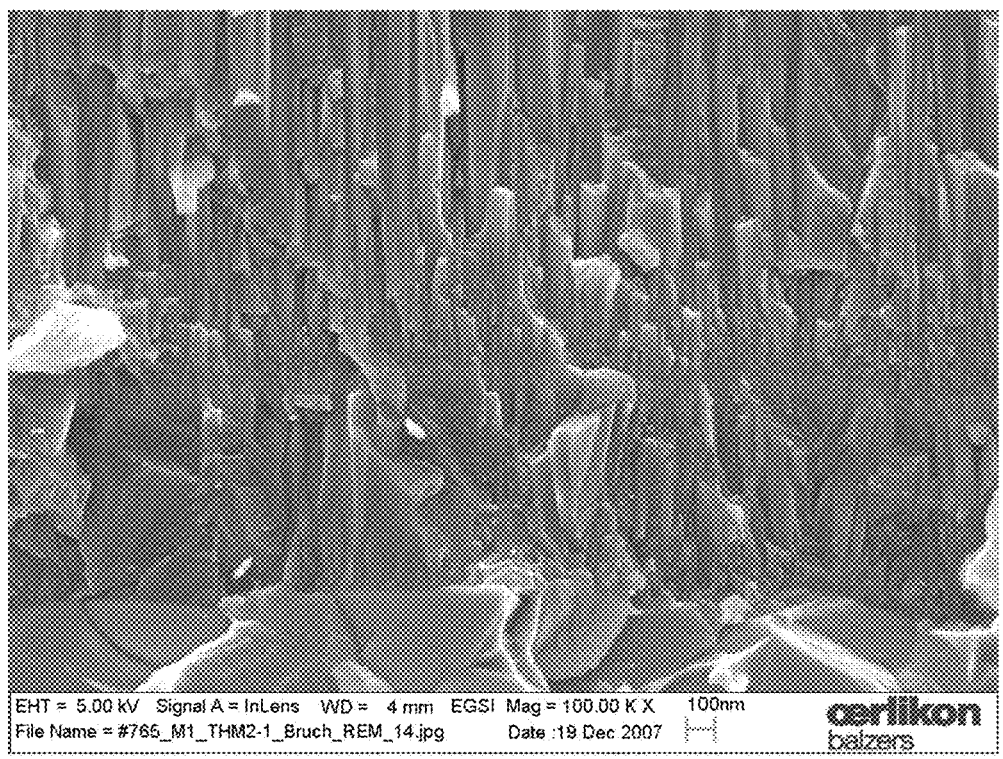
Figure 17A:
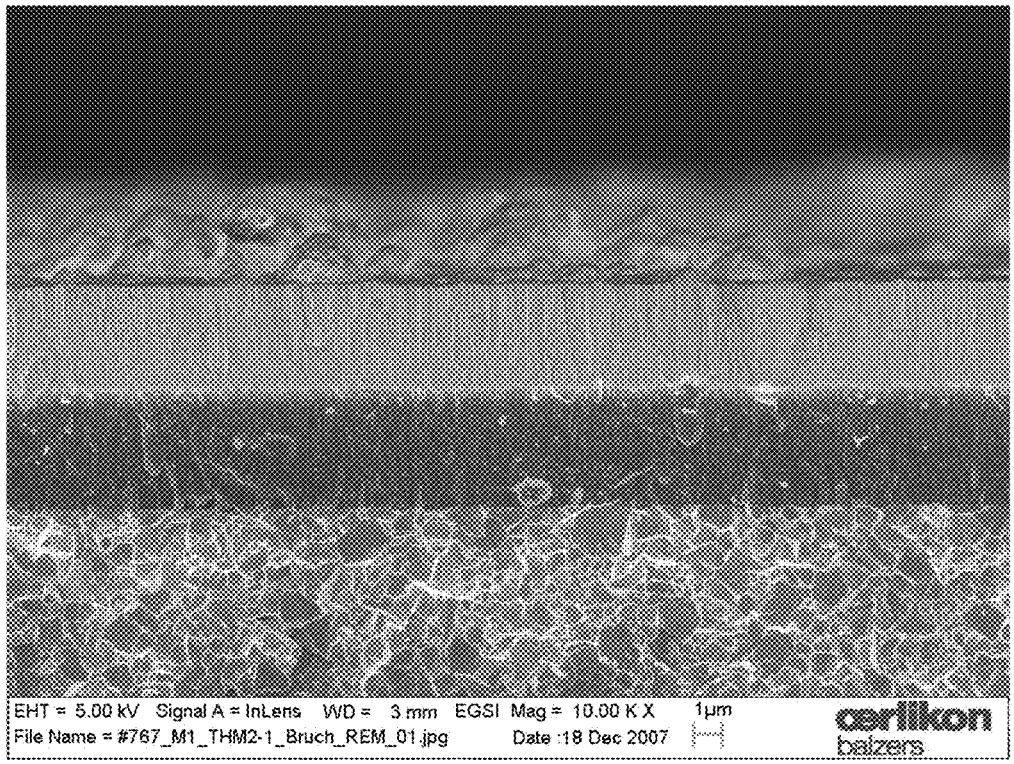
Figure 17B:
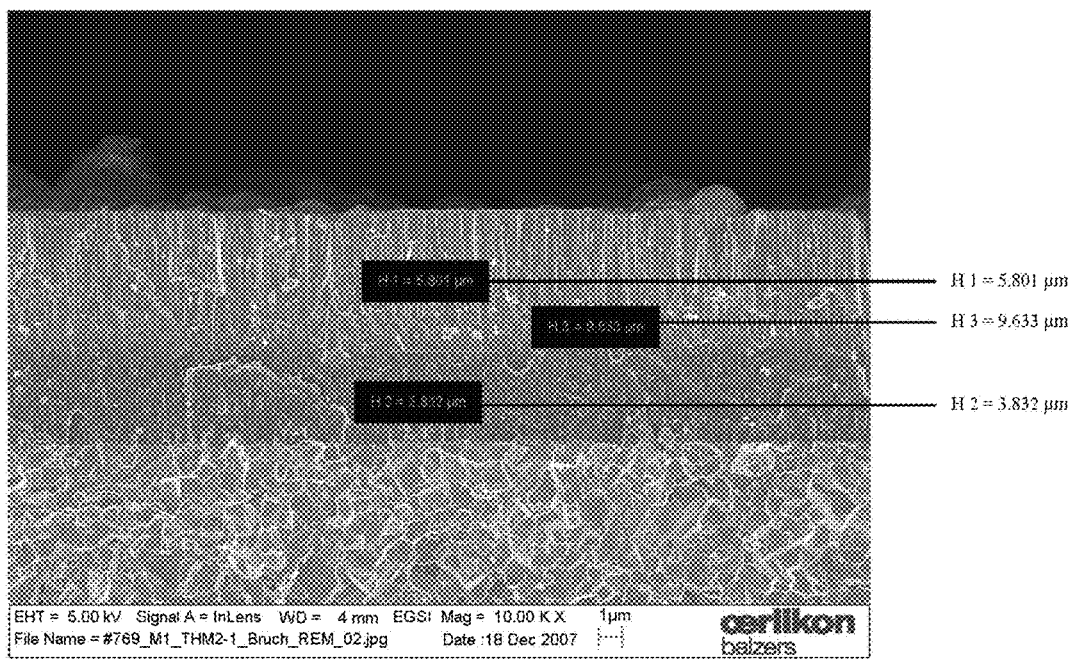
Figure 18A:
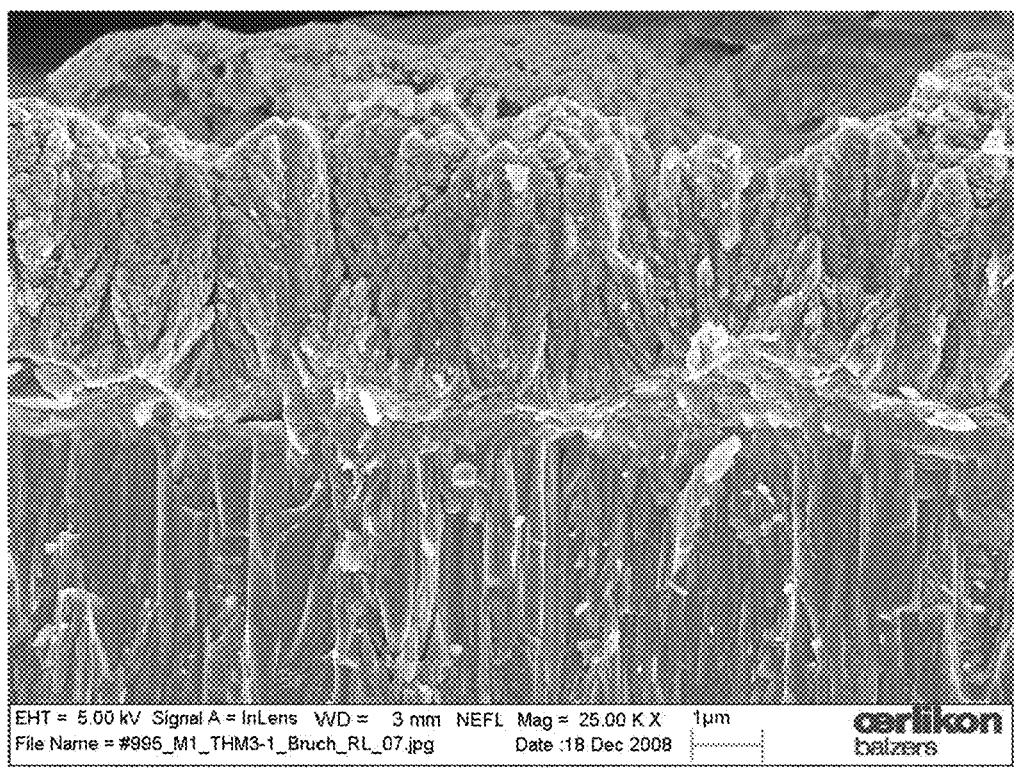
Figure 18B:
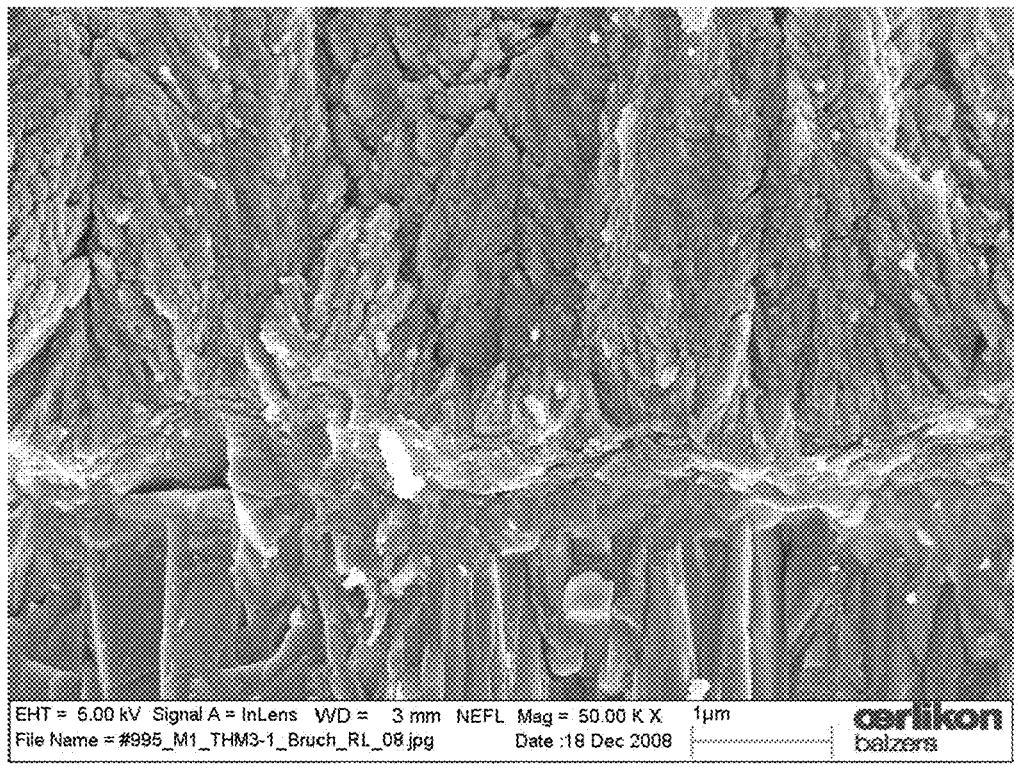

The following figures show the rupture cross-sections of these layers, which were analyzed in the SEM:
  FIGS. 15a and 15b show a thick Zr—O layer (sample 493) that has been applied onto a chromium-chromium oxide intermediary layer.
  FIGS. 16a and 16b show the microstructure of a Zr—O layer, produced with elemental Zr targets and with a high oxygen flow of 600 sccm. As interface, a thin TiCN of approx. 500 nm was selected.
  FIGS. 17a and 17b show the comparison of Zr—O layers deposited on a thicker TiCN layer of approx. 3.5 μm, wherein 17a (sample 767) was operated according to US_20080020138 A1, 17b (sample 769) however pulsed as described in US_20070000772 A1.
  FIGS. 18a and 18b (sample 995) show a further SEM analysis of a rupture of a sample, in which a Zr—Y—O function layer was deposited by means of Zr(92 at %)/Y(8 at %) targets on a thick CrN layer.

The layers produced with the methods indicated above by means of example were analyzed and will now be described in more detail.

First, the layers from example 1, described in table 1, will be discussed. On the one hand, the interpretation is based on XRD measurements under grazing incidence diffraction of 1, which in the case of a total layer thickness of the examined layers of approx. 5 μm nearly excludes or strongly inhibits the influence of the layer area close to the substrate and thus of the SL.

In order to determine the composition of the layer, on the other hand, RBS (Rutherford Backscattering Spectrometry) and ERDA (Elastic Recoil Detection Analysis) were performed. These results have also been recorded in table 1.

Figure 26A:
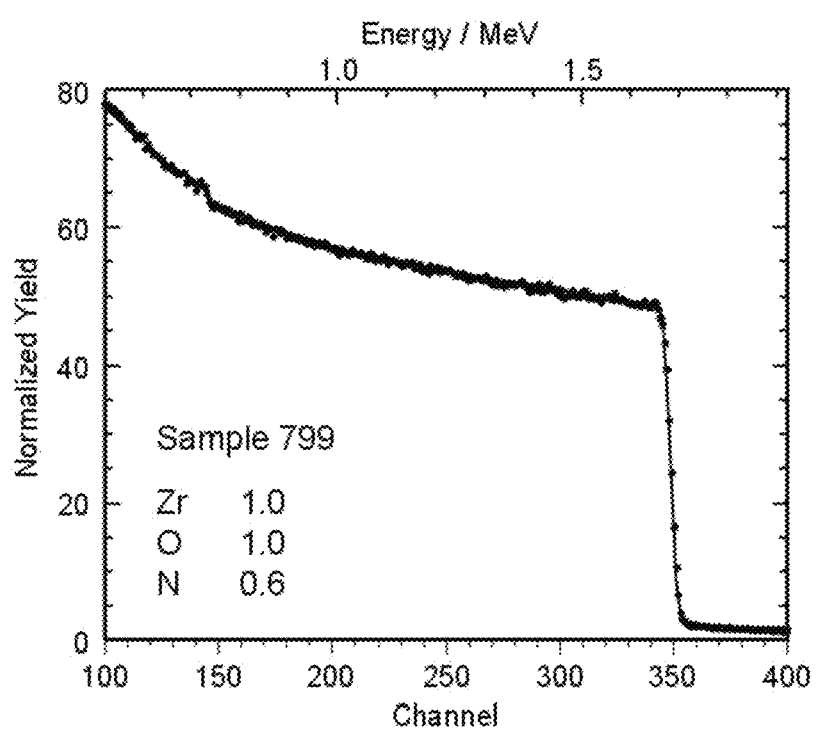
FIG. 26a shows an RBS (Rutherford Backscattering Spectrometry) spectrum.
Figure 26B:
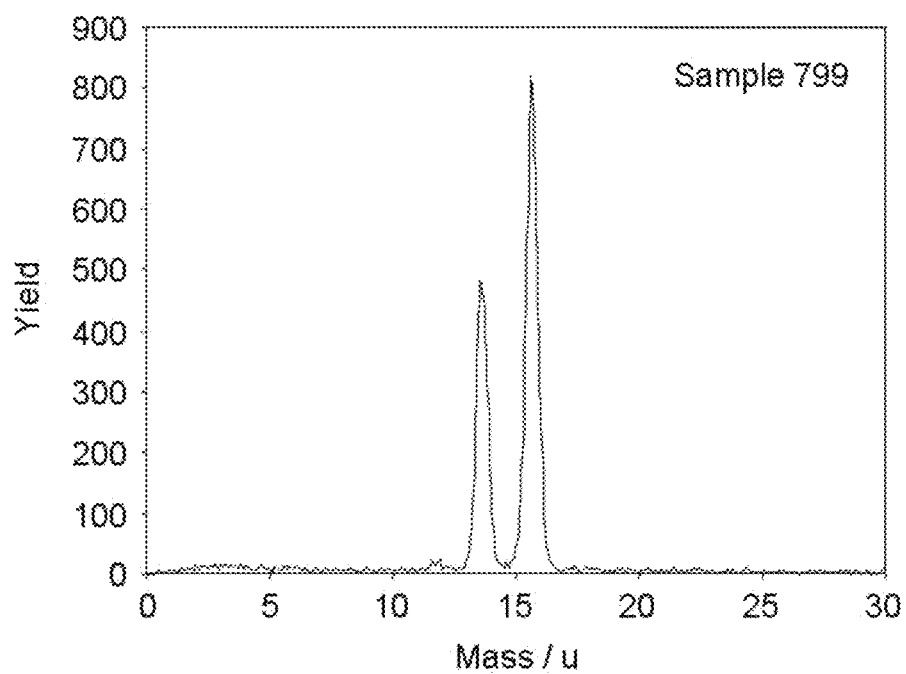
FIG. 26b shows an ERDA (Elastic Recoile Detection Analysis).

For sample 799, FIG. 26a shows by way of example an RBS spectrum, which after the analysis indicates a layer composition of $Zr_1O_1N_{0.6}$. The ratio of nitrogen and oxygen for this sample was determined more precisely by means of ERDA. The corresponding measurement is represented in FIG. 26b.

Figure 20:
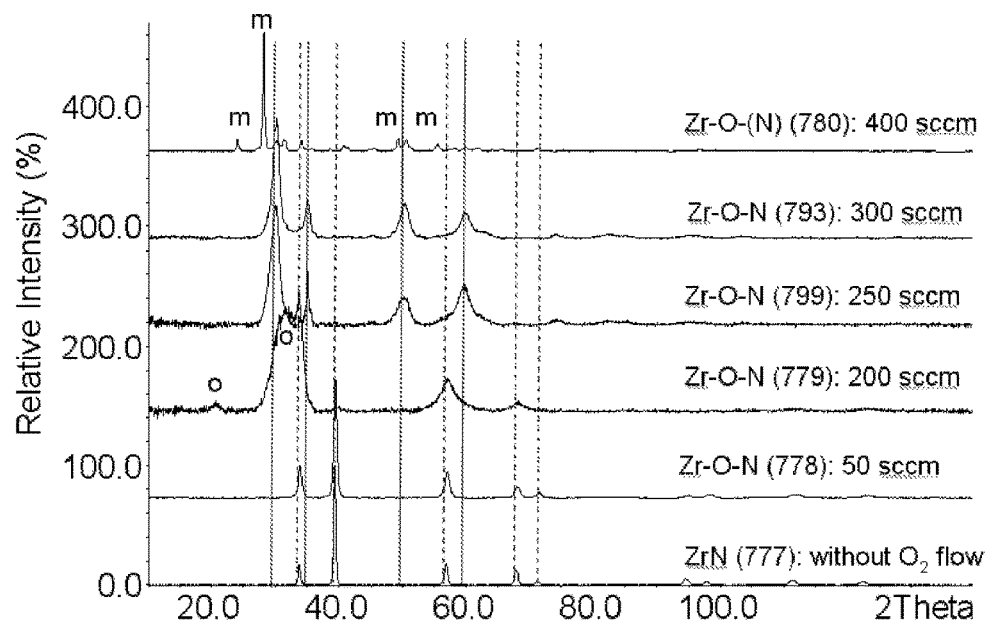
FIGS. 20 to 25 show XRD spectra for different samples.

For sample 777 (FIG. 2), the 4 Zr targets were operated in pure nitrogen. The SRD spectrum (FIG. 20) shows the Bragg Peaks of ZrN with cubic structure (a=4.575 Å). The analysis of the layer by means of RBS yielded a composition that can be described as Zr1N1.1 and which does not indicate any other layer components. The 10% "over-stoichiometry" of the nitrogen lies in the error margin for the light elements of the RBS method. This error range was also the reason for an ERDA analysis for O and N to be performed on the samples in order to more accurately determine the oxygen-nitrogen ratio (O/N) resp. (N/O) (results also in table 1).

Through the adjunction of oxygen at 50 sccm (sample 778) and 200 sccm (sample 779), the cubic structure essentially remains after the XRD. For the layer composition, an O/Zr ratio of 0.12 at 50 sccm (sample 778), which increases to 0.74 at 200 sccm (sample 779), i.e. in both cases oxygen is integrated into the layer in addition to nitrogen. Despite the cubic structure being retained, in both probes there is a proliferation of Bragg Peaks, which indicates that cubic ZrO (a=4.62) or Zr (O, N) or ZrO2-x or a mixture from these phases are formed. At 200 sccm, there are peaks that point to small proportions of the orthorhombic phase of the ZrO2 in addition to the existence of the cubic phase of ZrO monoxide.

Figure 21:
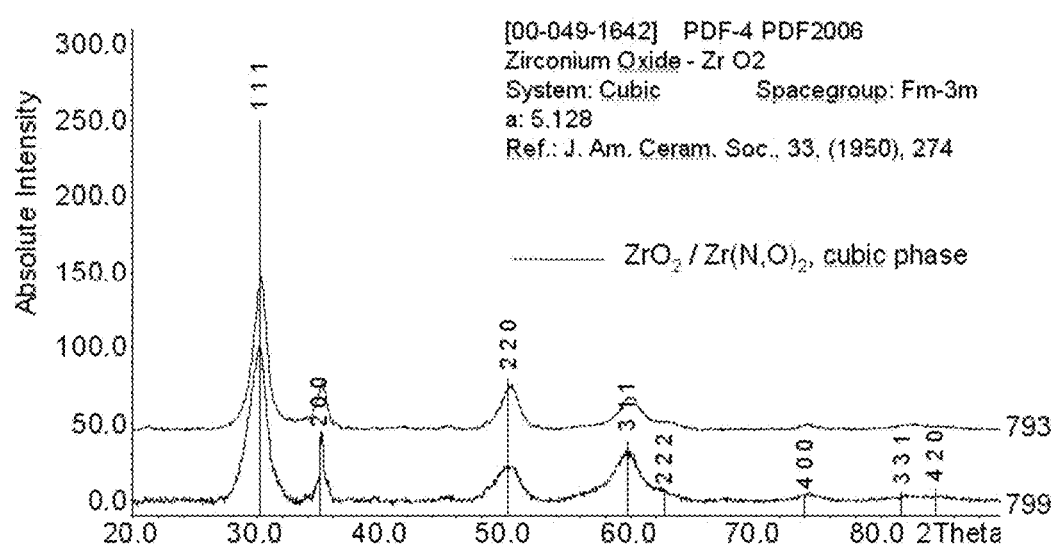

From 250 sccm (sample 799) upwards, the cubic resp. tetragonal phase is formed, possibly a phase mixture as indicated by the peaks (111) and (200), represented in magnified fashion in the XRD spectrum in FIG. 21. These two phases can hardly be separated at small crystallite sizes on the basis of the XRD spectrum.

At 300 sccm, the crystallinity of this phase resp. of this phase mixture increases until at 400 sccm it clearly changes over to the monoclinic phase with proportions of cubic resp. tetragonal phases. The increase of the oxygen flow is accompanied by an increase of the O/Zr ratio resp. the decrease of the N/Zr ratio (table 1).

As a result of these measurements, it is possible to say in summary that with the coating process described above of reactive spark evaporation while using elemental Zr targets, it is possible to achieve a transition from cubic ZrN to a mixture of cubic ZrN/cubic ZrO (monoxide) and finally over to the cubic resp. tetragonal phase or of the phase mixture of the cubic ZrO2, i.e. the nitrogen or the cubic ZrN function as a kind of new "stabilizers" in order to achieve the cubic resp. tetragonal phase of the ZrO2.

A particular advantage is the fact that the entire transition can be achieved solely by changing the oxygen gas flow whilst simultaneously controlling the total pressure, thus a very simple process has been developed in order to be able to produce cubic resp. tetragonal ZrO2 without the stabilizers known so far in the literature.

As further result, the following can be noted:

First, it is possible by periodically inletting small quantities of oxygen flows to create a multi-layer system of ZrN/Zr(O,N) (similar to sample 777/779) having a completely cubic phase, i.e. always switching between cubic ZrN and cubic Zr(O,N).

On the other hand, these multi-layer systems can also be synthetized in the area of the oxygen flow, just where the transition between nitrogen stabilization and the formation of the monoclinic phase takes place, and thus a multilayer structure can be created between the cubic resp. tetragonal phase of the ZrO2 (with portions of cubic Zr(O,N)) with and without nitrogen portion. The condition for this is however that those layers without nitrogen are kept so thin that there is no switching into the monocline phase yet. FIG. 6a (sample 780), although the entire layer was produced with an oxygen flow of 400 sccm, exhibits a morphology change after approx. 1.7 μm of the FL from a dense to a columnar structure. This change involves a phase change of the cubic resp. tetragonal structure to the monoclinic structure. This means, therefore, that cubic resp. tetragonal layer growth can be achieved for a period of time without integrating nitrogen into the layer (table 1, sample 780). Or, in other words: the N-stabilization results in the layer being stabilized for a while longer through the underlying layer with nitrogen content without itself featuring nitrogen.

Yet another aspect of this process solution can be relevant for the application: the possibility of properly bonding the Zr—O layers to the underlying substrate or layer system in a gradient way by using a ZrN layer, because a good bonding to metallic substrates or layers as well as a layer growth based on only one material system can be achieved.

The figures of the rupture cross-sections from the SEM examinations demonstrate this. For example, 1b, 4b and 6b show the close bonding of the approx. 500 nm thick ZrN intermediary layer (SL) to the function layer (FL), whilst 18b shows a considerably worse bonding, since the ramp into the high oxygen content of the ZrO2 was kept very short.

Figure 1B:
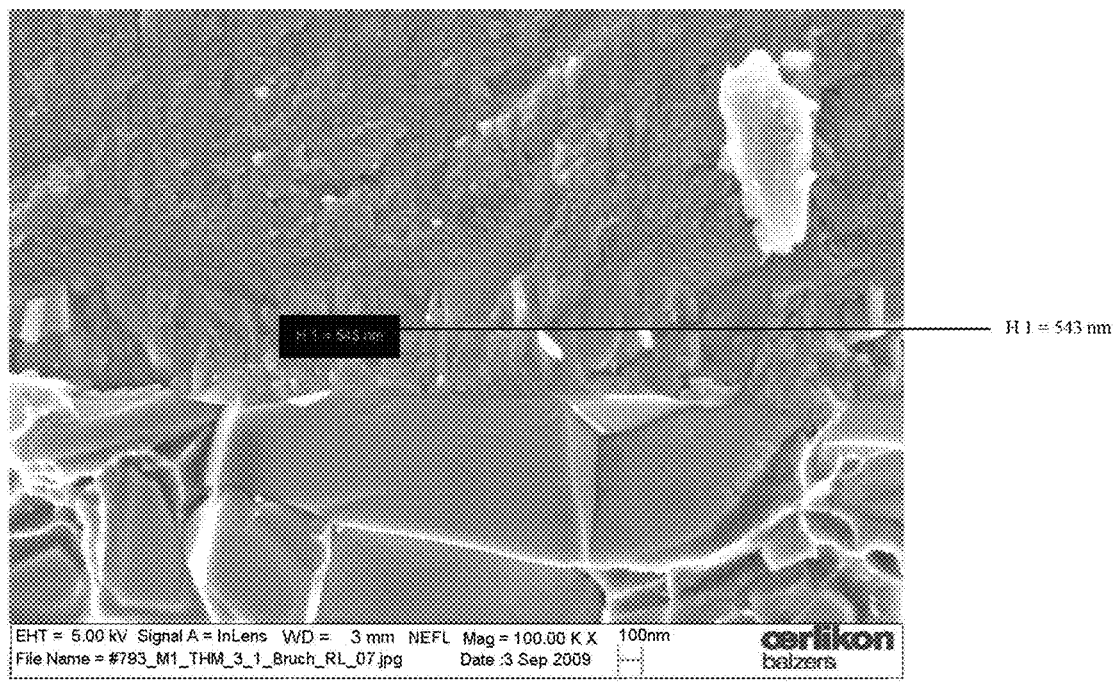

The analysis of the layers from example 1 shows another surprising result: the layer morphology changes with the oxygen flow. Whilst the ZrN (FIG. 2) is very compact, the layer at the beginning becomes very small-grained or amorphous (FIGS. 3 and 4). The further increase of the oxygen flow leads increasingly to more pronounced vertical structures in the layer growth (FIGS. 5 and 1), that finally goes over to columnar structure (FIG. 6). These results enable for example applications in which the harder cubic phase is covered with a softer monoclinic phase (analog to FIG. 6), in order for example to optimize tribological systems such as run-in processes for turbine blades or for other components in the field of combustion engines, with the aim of reducing the wear of the counter body.

On the other hand, it would often also be desirable for the layer morphology to be capable of being changed without the phases changing at the same time. The condition for this is that stable phases are generated that are not independent or at least not greatly independent of the oxygen flow.

Figure 7B:
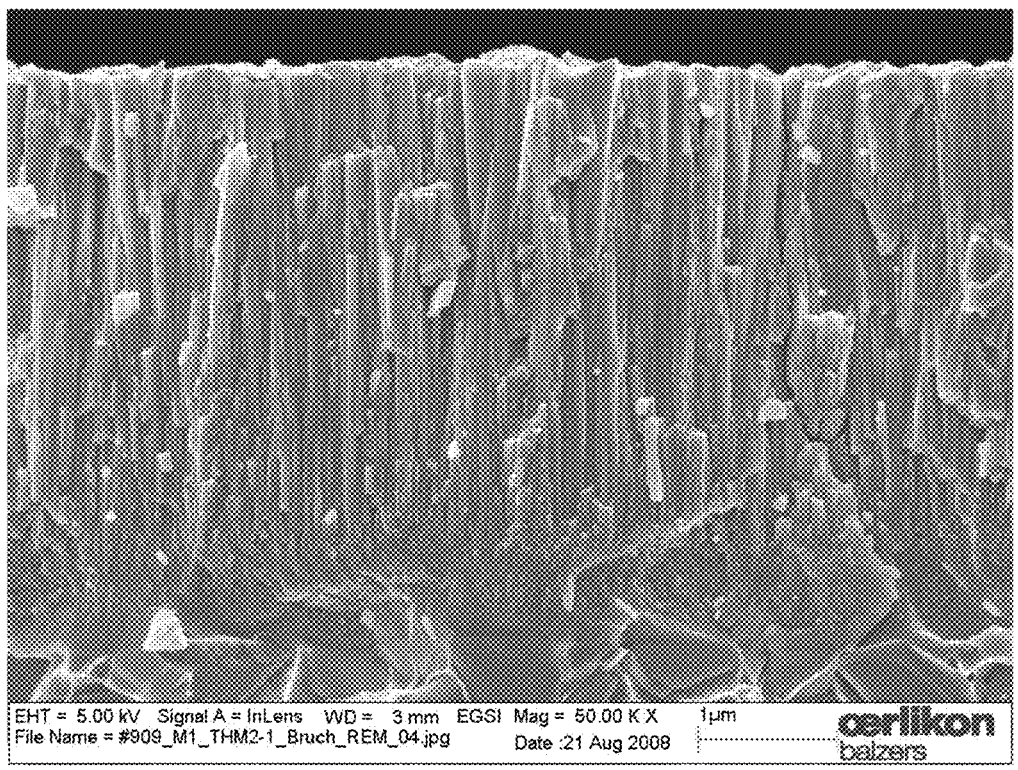
Figure 22:
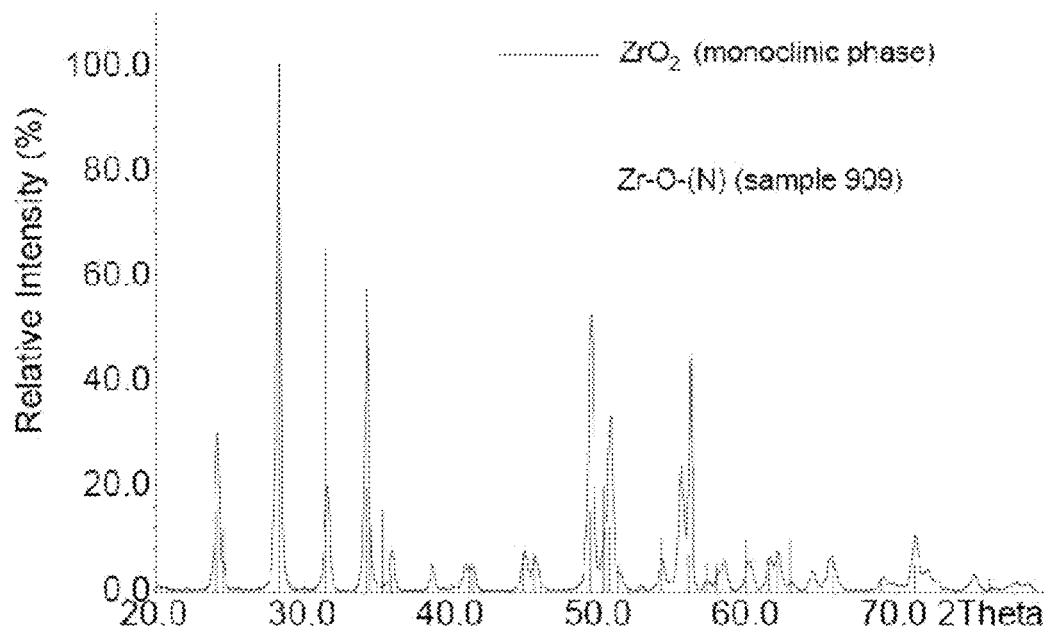

This was a motivation for the further process developments that were carried out according to example 2 and whose results have been summarized in table 2. In the case of sample 909, 4 elemental Zr targets were again used and a Zr—O—N layer was deposited with an oxygen flow of 350 sccm on an intermediary layer of again approx. 500 nm ZrN. The XRD spectrum of this layer in FIG. 22 clearly shows the Bragg Peaks of the monoclinic phase of the ZrO2. This is in accordance with the results of the layers that were produced according to example 1 and in which, with an oxygen flow between 300 sccm and 400 sccm, the cubic resp. tetragonal phase switches into the monoclinic phase. Despite the nitrogen background pressure (total pressure control), the layer did not show any nitrogen proportion in the layer after ERDA, i.e. the N-content is smaller than 1 at %. But this too is approximately consistent with the samples from example 1, wherein at 400 sccm no more N is found in the layer. The morphology of the layer (FIG. 7) is also comparable with that of sample 780, at least in the area close to the surface, and exhibits columnar structure.

The further layers in table 2 were then produced in such a way that the intermediary layer was synthetized by 2 pure Zr targets, whilst for the function layer (FL) 2 Zr(85 at %)/Y(15 at %) targets were used. The oxygen flow was then varied with the aim of modifying the layer morphology.

Figure 10B:
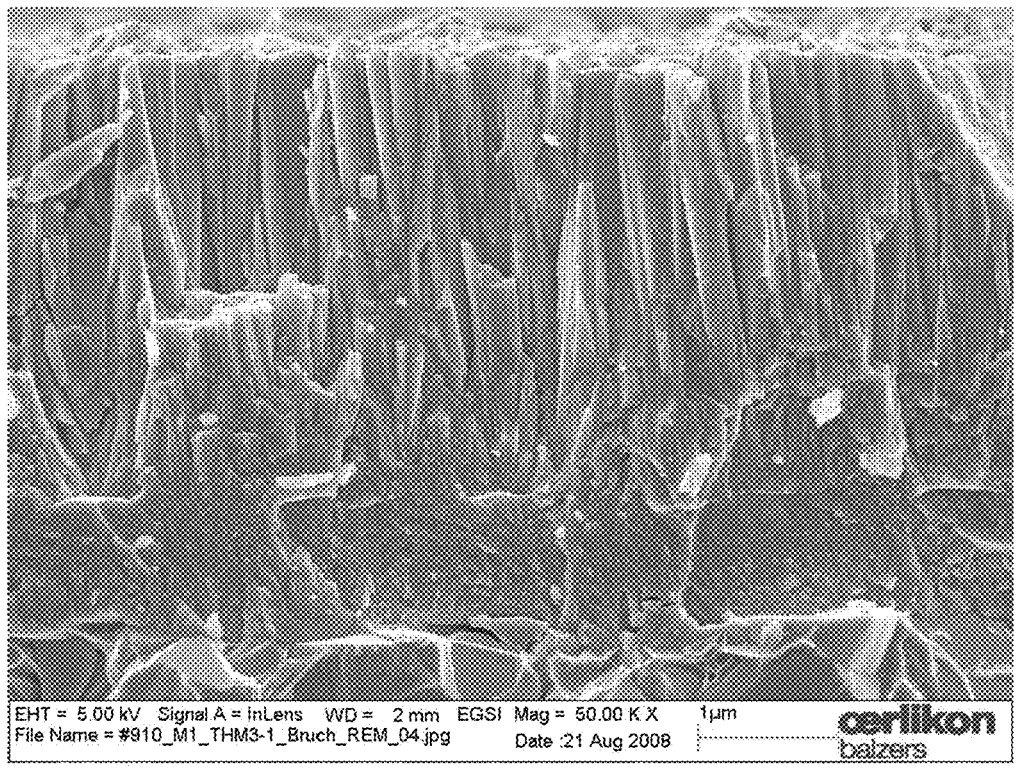
Figure 23:
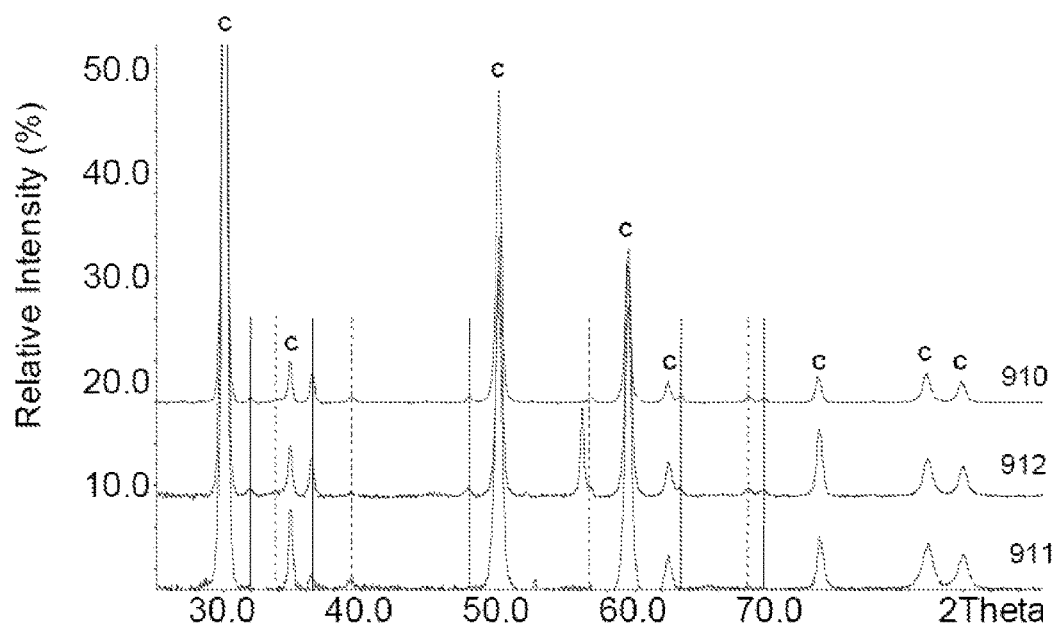

For sample 991 (200 sccm), a relatively compact layer morphology can be seen in FIG. 8. If the oxygen flow is further increased, the layers will exhibit columnar growth in an increasingly clear manner (samples 912 and 910 in FIGS. 9 and 10). The XRD spectra of the probes, in which the FLs were produced with Zr/Y targets, are represented in FIG. 23.

For all layers, independently of the oxygen flow, the Bragg Peaks of the cubic structure of the ZrO2 can be seen. Few Bragg Peaks with low intensity probably come from the ZrN intermediary layer (cubic and hexagonal phase). A more detailed analysis of the peaks originating from the cubic phase at $2\Theta\cong30°$ and at $2\Theta\approx50°$ is introduced in table 3. From this, one can conclude that an increasing oxygen flow leads to a higher crystallinity (greater crystallites), since the FWHM (Full Width at Half Maximum) gets smaller. As in the spectra, there is no indication of a peak at $2\Theta\approx43°$ which would be typical for the tetragonal phase of the ZrO2 and which should be seen at this increased level of crystallinity, so it can be concluded that essentially in all these samples, only cubic phases of ZrO2 are present and no tetragonal ones. It should also be mentioned that because of the classical stabilizer also in essentially higher oxygen flows (e.g. at 1500 sccm oxygen flow), the cubic phase remains present and does not convert to the monoclinic phase.

This will yield the following important results from the experiments. The introduction of a classical stabilizer as known from the sintering technology and other methods into the target used for spark evaporation leads to the tetragonal and cubic phase of the ZrO2 to become stabilized. When Y is used as stabilizer, the cubic phase with Y target components in excess of 8 at % will be achieved as is clearly visible in the XRD. Below this concentration, a phase mixture of cubic and tetragonal phase will be found in the layer (see the experiments further below). The cubic phase also does not change when the oxygen flow is increased, as was the case for the samples according to example 1. In the layers, in contrast to the layers according to example 1, no nitrogen is integrated already at an oxygen flow of 200 sccm, although the total pressure was set at 3.5 Pa. In these conditions, it is for example necessary to assume, for an oxygen flow of 300 sccm, a nitrogen flow of about 800 sccm in order to obtain the total pressure of 3.5 Pa, i.e. there will be considerably more nitrogen in the installation but it will however not be integrated into the ZrO2.

In example 3, Zr—Y—O—(N) layers were produced that are described in table 4. For these examples, a layer of "foreign" material was used, namely TiCN was chosen as intermediary layer (SL). The transition into the Zr—Y—O—N layer was again run through the total pressure control. This time, however, Zr(92 at %)-Y(8 at %) targets were used.

Figure 24:
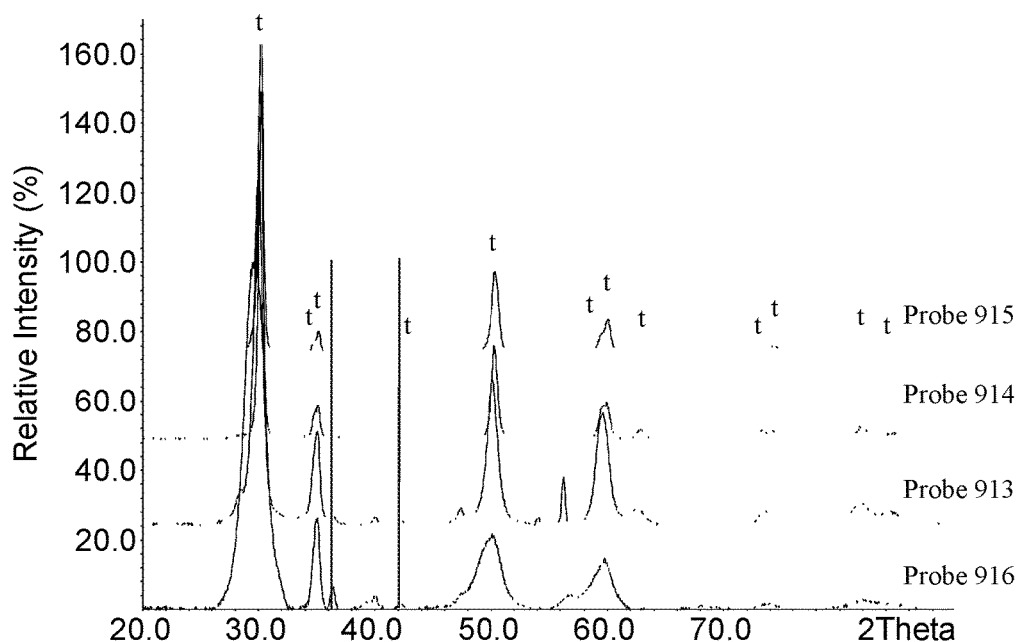

The results of the XRD measurements are represented in FIG. 24. All layers show a dominant tetragonal phase, since the Bragg Peaks at $2\Theta=43°$ and the splitting of the peaks at about $2\Theta=60°$ are visible, at which the pure cubic phase does not appear. Proportions of the cubic phase in these layers can however not be excluded. In table 5, the FWHM of the Bragg Peaks at $2\Theta=30°$ and at $2\Theta=50°$ are indicated for the different oxygen flows. For these experiments, an increased crystallinity can thus also be observed at an increased oxygen flow. Even with Y at only 8at % in the targets, the layer was stabilized in such a manner that even at higher oxygen flows, no monoclinic phase was produced, but rather the tetragonal phase (with possible cubic portions) remained stable.

Figure 25:
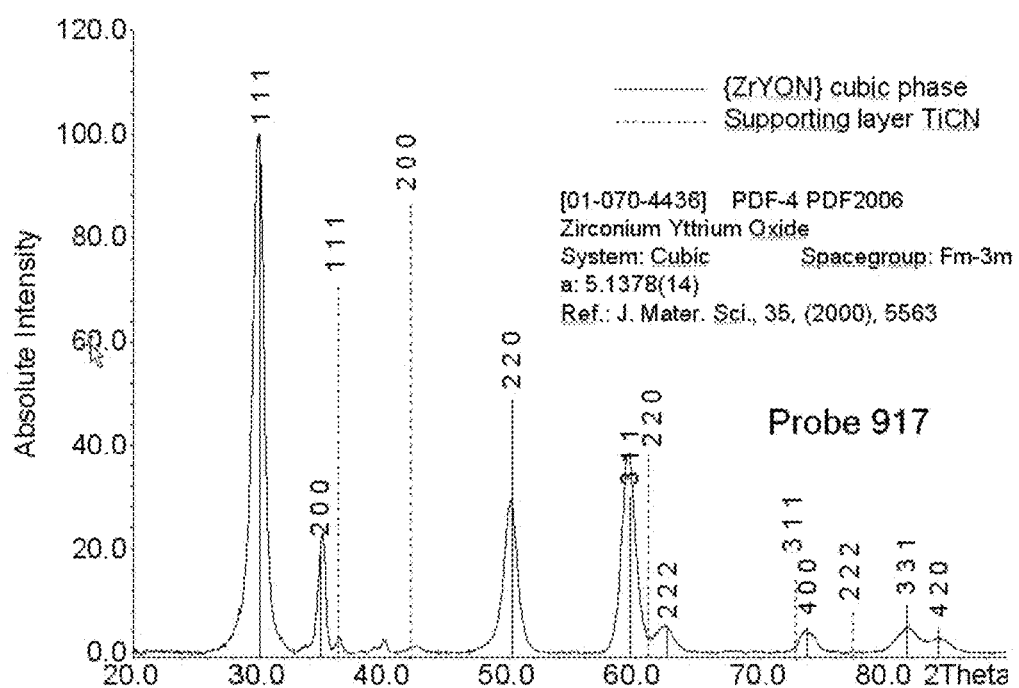

For sample 917, whose XRD spectrum is shown in FIG. 25, and whose process parameters and analysis are partly included in table 4, a pronounced, i.e. a thicker cubic zirconia layer was run. This led to a mainly cubic phase of ZrO2, as shown by the prominent peaks in the XRD spectrum of FIG. 25. It will be noted that the splitting of the peaks at 60° that is typical for the tetragonal phase is not present.

To conclude, other examples of layers will be discussed that can be produced according to the above method.

FIG. 15 shows the SEM rupture cross-section of a thick Zr(Y8 at %)O2 layer (sample 493) with tetragonal structure, applied onto a chromium-chromium oxide intermediary layer. For the coating, Zr(92 at %)/Y(8 at %) targets were used and the coating took place at a very high oxygen flow of 1500 sccm. In this process, no total pressure control was used but rather the evaporation of the Zr(92 at %)/Y(8 at %) targets was done under constant oxygen flow.

This illustrates that an oxide, here the chromium oxide, can also be used as intermediary layer in order to bind "related" materials to one another. This can make sense when for example the thermal expansion coefficients need to be adapted to one another, of which many are similar as oxides.

It can be seen from the figure that the high oxygen flow converts the columnar structure into an even less dense morphology with higher porosity and accordingly greater surface. Such a surface is particularly suited for applications in the field of sensors as it both contributes to the faster diffusion of the species to be detected and also increases the sensitivity. The XRD spectrum (not represented) shows the Bragg Peaks of the tetragonal structure with proportions of the cubic phase, and shows that even without the total pressure control in the nitrogen, the tetragonal resp. cubic phase can be produced.

FIG. 16 shows the microstructure of a ZrO2 layer produced by elemental Zr targets and also with a high oxygen flow of 600 sccm. As interface, a thin TiCn of approx. 500 nm was selected. Again, only the oxygen flow was controlled and not the total pressure with nitrogen background. The layer exhibits the monoclinic phase. Although it does not have the preferred tetragonal or cubic structure, it is suitable for the protection of substrates especially in combination as run-in layer at high temperatures in order to prevent wear on the counter body.

Representation 17a and b show the comparison of ZrO2 layers deposited on a thicker TiCN layer of approx. 3.5 μm, wherein 17a (sample 767) was operated according to US_20080020138_A1, 17b (sample 769) however pulsed as described in US_20070000772 A1. Elemental Zr targets were used. The microstructure of the layers shows a clear difference. There is a greater crystalline growth in 17b. For both layers, the XRD spectra (not represented) indicate a monoclinic phase.

FIG. 18a and b (sample 995) show a further SEM analysis of a rupture for a probe in which a Zr—Y—O function layer was deposited on a thick CrN layer by means of Zr(92 at %)/Y(8 at %) targets. Again, a Cr—N—Zr—Y transition was selected and then, with a nitrogen total pressure control at 3.5 Pa, 600 sccm oxygen was added. The morphology of the layer is very porous and thus has a large layer surface. The tetragonal phase dominates in the XRD spectrum, though cubic portions cannot be excluded.

The inventive method is distinguished particularly clearly from other methods for producing ZrO2 (cubic and/or tetragonal) by the simple source material and by the possibility of influencing resp. of producing specifically, through this source material, the layer properties, especially the phase composition of the layer.

The difference is obvious to the sintering process, in which the materials are present in powder form and are bonded at high temperatures. The high temperatures are necessary in order to produce the material desired in the sintering process and depend very strongly on the adjunctions of foreign materials, for example of the stabilizer materials, and their concentration. Some materials cannot be produced or only in small quantities, since very high sintering temperatures are necessary. This both limits the material range and also restricts the economic efficiency.

The difference of the inventive method is also clear as compared to electron beam evaporation, which is confronted both with the changes in composition of the melt resp. in the material to be sublimated containing oxide in the crucible, as well as with the complex controlling of oxygen as reactive gas.

The same applies to the sputter method, which although it is less problematic than the electron beam evaporation as regards the evaporation of alloys, requires however a complicated controlling of oxygen as reactive gas in order to avoid target poisoning. Methods that combine spark evaporation and sputtering and use elemental targets, also solve this problem in an unsatisfactory manner. They cannot be operated in pure oxygen as reactive gas, since then on the one hand the sputter target as well as on the other hand the spark target are poisoned and the anode of the spark discharge is covered with an oxide layer and interrupts the discharge. Although this problem is not discussed in the publication, it can be inferred from the process guidelines that the process does not take place in pure oxygen atmosphere but only that oxygen is added to the argon working gas.

According to the invention, in contrast to the combined methods described in the literature, mixed targets are used for the production of the Zr—Y—O2 layers. These targets can be produced using known technology, for example powder-metallurgy technology in the HIP (hot isostatic pressing) method. With this method, it is possible to densify together materials having very different melting points without needing to melt them as in sintering. After the process, the materials are still present as separate materials in the target.

One advantage of the inventive method according to one embodiment is that these materials that are present separately will become alloyed with one another during the operation in oxygen resp. in the nitrogen-oxygen mixture under the effect of the spark moving on the target. Since the temperatures at the spark foot point can reach a few 1000° C., both high-melting materials such as Zr can thus be melted together with various concentrations of stabilizers, for example with Y between 1 at % and 25 at % on the target surface immediately before the transition into the vapor phase.

To perform this process in argon gas would lead to a large number of spatters. In oxygen or in a nitrogen-oxygen mixture as reactive gas, these materials that are different in terms of melting temperature can be bonded well to one another. The alloying process at the target surface affords great freedom in the choice of the source material for the target production, since powders with grains of a middle-size between 1 µm or smaller and 100 µm and larger can be used. A variant of the inventive method is thus that no working gas, such as argon, is used.

The pulsing of the spark sources according to US_20070000772_A1 accelerates this alloying process or conditioning process at the target surface. The grain sizes of the target cannot be found in the deposited layer again, since first the conditioning takes place on the target surface, and only then does the evaporation occurs.

As discussed above, the crystallite size can be regulated through easily accessible process parameters such as oxygen flow, substrate temperature and through the selection of intermediary layers.

The targets that are to be used for the inventive method can also be produced through plasma spraying, by using metal-organic gases as precursors to the deposition of the metallic layer components onto a target substrate. The advantage of this target production method is that through the concentration of the precursor, only one alloy at the time is deposited. The disadvantage then is the higher porosity of the plasma sprayed target vis-à-vis those produced in the HIP method, which however in the inventive method is in principle controlled in pure oxygen atmosphere.

To summarize, it can be said that, in contrast to the state of the art so far, alloyed spark targets yield unsurpassed reproducibility in the source material and that the combination of the target operation in oxygen atmosphere, under the fringe condition of near free choice of the nitrogen-oxygen mixture of reactive gases, enables both the layer morphology to be adapted as well as the layer phases to be specified.

Hereafter, the most important advantages of the present invention will be enumerated again, arranged according to process and layers.

Process

The process of reactive spark evaporation of elemental Zr and/or of mixed targets from Zr, if required under the adjunction of other materials such as for example stabilizers St, for example Y, is suitable for a simple and cost-effective synthesis of cubic resp. tetragonal ZrO2 resp. Zr-St-oxide.

The process enables targets with a concentration ratio according to the desired layer composition to be used. Such targets can for example be produced cost-effectively by the HIP (hot isostatic pressing) method or plasma spraying. In the case of plasma spraying, the desired metallic alloy can already be deposited to the target, i.e. for example in the ratio Zr96/Y4, Zr92/Y8, Zr90/Y10, Zr85/Y15.

The method enables the combination with synthesis of different layer materials in the same coating system and in the same process step.

The method provides graded transitions between different materials for the purpose of improving the bonding between them, of adapting the layer properties and of specifically adapting the layer properties such as morphology, crystallite size, crystal structure or phase composition.

The use of a spark anode that is kept conductive through temperature change cycles (switching on and off) in connection with the resulting mechanical deformations causing spalling of the oxidic layers, advantageously contributes to stabilizing the spark evaporation in oxygen atmosphere.

With total pressure control on the nitrogen, the different phases of the ZrO2 can be synthetized by regulating the oxygen flow. The nitrogen seems in a certain sense to enable the tetragonal or cubic phase to be stabilized.

The adjunction of stabilizers in the target in a specific concentration essentially results in a synthesized layer with the same concentration, i.e. no regulation effort is required as is the case for the evaporation of materials of separate elemental targets. The concentration of the stabilizers determines essentially the phases of the synthesized layer resp. its phase composition.

In the case where classical stabilizers are used, whilst maintaining the phase resp. the phase mixture, the crystallite size and the morphology of the layer can be controlled through the oxygen flow and the substrate temperature, i.e. the phases to a large extent are independent of the oxygen flow.

The combination in the use of elemental Zr targets and alloy targets that contain solid stabilizers in addition to the Zr also enables graded transitions between Zr—O layers and Zr—Y—O layers, in which the Y content of the layer can be varied between 0 and the Y content of the alloy target resp. of course also in the opposite direction. An example is the synthesis of a cubic ZrO2 layer containing stabilizers and in which a graded transition to zirconia takes places without stabilizers, i.e. from a certain thickness without stabilizers the hard cubic structure is bonded with the one from the soft monoclinic structure, which can then serve for example as run-in layer.

The method enables the integration of stabilizing materials over the gas phase, for example the extensively discussed example of nitrogen. The integration of these materials can also be expanded by the intake of additional reactive gases (to nitrogen and/or oxygen) that then become equally built into the layer. Examples of this are: hydrocarbons, silane, hydrogen, borane, cyano-compounds. Such further gases can also be added to pure oxygen as reactive gas, in case there is no total pressure control of the nitrogen background.

The possibility afforded by this method of producing graded transitions between different layer materials is of particular importance for adapting the layer materials in relation to the thermal expansion coefficients (graded transitions between metals, metal nitrides, metal carbon nitrides, metal oxides). This grading possibility enables the hitherto unsolved problem of achieving good bonding onto metallic substrates to be solved.

The possibility of grading furthermore makes it possible to adapt the thermal conductive properties of the layers to be adapted. Measurements have shown for a cubic stabilized Zr—Y—O layer thermal conductive properties of 1.8 to 2.5 W/(mK) (dependent on the morphology). This thermal conductivity is smaller than that of other oxide layers, for example of AlCr—O (3.2 . . .), that were also produced by means of reactive spark evaporation. This enables an adaptation of heat transitions in layer systems.

The inventive possibilities of influencing the layer morphology and the phase composition also enables mechanical properties such as layer hardness and toughness to be adjusted.

The use of alloy targets, in contrast to the prior art, essentially does not lead to a separation of the target components in the layer, i.e. the target composition is essentially reflected also in the layer, and provides crystallite sizes in the layer that are independent of the crystallite size in the target material.

The method reduces considerably the spattering of the target material as occurs in the other methods in that it converts to a large extent the powder in the source material (target) to intermetallic compounds at the target surface.

The method makes easier and possible the integration of practically all stabilizers and dopings that contribute to increasing the ion conductivity, for example the stabilizers disclosed in US_05709786. This can occur in a simple manner and practically without material limitation.

The crystallite size of the layer can be adjusted independently of the used grain size of the powder used in the target.

The vacuum process in combination with the use of the targets produced from pure powders reduces impurities of the layer through other substances up to less than 1 at %.

The alloy process on the target usually takes place quickly and does not generally compromise the quality of the intermediary layer. If necessary, it can however also be separated from the layer deposition onto the substrates through the use of shutters in front of the target.

Advantages of the inventive zirconia layers (hereafter called layers):

The layers can exhibit cubic or tetragonal phases, although they have no proportions of "classical stabilizers", e.g. Y, in the layer.

The cubic resp. tetragonal phase of the layer can be grown on a cubic substrate layer. A particular advantage is the growth on substrate layers of cubic phase that essentially contain Zr as metallic component, e.g. cubic ZrN, cubic ZrO or cubic resp. tetragonal ZrO2.

The layers of a different phase or phase composition can exhibit a graded transition to the substrate layer, which is reflected in a N—O gradient and whose depth profile within the layer can be demonstrated for example by means of SIMS.

The phase of the layer or its phase composition remains essentially within the substrate temperature range between 200° C. and 700° C. Only the crystallite size changes, i.e. at lower temperature the layer becomes microcrystalline resp. amorphous whilst at a higher substrate temperature larger crystallites are obtained. In this manner, layers can be produced both with crystal sizes in the nanometer range but also with crystal sizes up to 100 nm and beyond.

The synthetized Zr—O2 layers are sub-stoichiometric as regards oxygen, which can be substantiated through an RBS analysis. It should be noted here that this RBS analysis also takes into account the fact that the elements Zr and Y in the spectrum cannot readily be separated, but that this was taken into consideration during the assessment, as was the different valence of Zr (ZrO2) and Y (Y2O3) in the oxide formation, so that even when taking into account these effects, there still is a sub-stoichiometry of the oxygen resp. Zr.

The layers have the metallic spatterings typical for spark evaporation and that consist primarily of the high-melting Zr and are not fully oxidized.

With the properties described above, the layers produced with the inventive method are very well suited for different applications.

According to the present invention, such layers produced by means of spark evaporation are preferably used as solid electrolytes in fuel cells.

Because of the good ion conductive properties, the layers can be used perfectly well in sensors.

As discussed above, the layers produced according to the invention form very good thermal barrier layers and can thus be used for the protection of tools and components like for example turbine blades and turbochargers. Furthermore, the inventive zirconia layers can advantageously be used as high-temperature protection layer against wear for tools and in particular for cutting tools such as for example disposable cutting inserts and drilling bits.

If the layer system includes a zirconia layer in monoclinic phase, it can be used as friction-reducing layer in high-temperature applications.

In the frame of the present application, a method for the production of zirconia layers has been proposed with which, when the zirconia layers are used as solid electrolyte layer, this solid electrolyte layer can be bonded without problems with other substrates and/or layers by means of graded transitions.

With the proposed method, specific changes of the layer morphology without phase changes are possible to achieve in an easy manner.

On the other hand, in the frame of the inventive method it is possible, with a simple change of the oxygen flow, to change the phase of the layer, for example from cubic to monoclinic.

It has been shown that in the frame of the inventive method it is possible to forgo at least partly, often even completely, the use of classical stabilizers by integrating nitrogen into the system. In particular, the use of nitrogen enables the cubic ZrO2 phase to be stabilized without classical stabilizers.

It has been shown that by means of the inventive method, in particular when a classical stabilizer is used, the crystallite size can be changed specifically, by changing the oxygen flow and/or the substrate temperature.

In the frame of the proposed inventive method, it is possible to integrate into the layer classical stabilizers that themselves have a high melting point at considerably lower substrate temperatures.

It has been shown that in the frame of the inventive method, multi-layer structures with bi-layers in the nanometer range can be produced. Examples of such bilayers are ZrN/ZrOx transitions, ZrO/ZrO2 transitions, $ZrO2_{(trigonal\ or\ cubic)}/ZrO^2_{(monoclinic)}$ transitions.

It has been shown that the source materials required for the method are easy to produce and easy to use.

Furthermore, it has been shown that it is possible with the inventive method to achieve layers essentially without undesired components.

It has furthermore been shown that in the frame of the inventive method it is possible to work with oxygen partial pressures greater than 0.1 Pa.

Finally, the possibility should be mentioned of producing by means of the method not only cubic zirconia layers but also such powders. For this, the total pressure in the spark evaporation installation can be chosen at such a high level that on the basis of the strongly reduced average free path length, a large proportion of the material does not land on a substrate to be coated but remains as powder in the chamber.

A further possibility would be, prior to the coating, to coat the substrates with an easily removable sacrificial layer so that the latter can be removed together with the subsequently applied zirconia layer. As sacrificial layer, for example a thin graphite layer that is simply sprayed on is suitable.

9. Tables

TABLE 1

| Sample | Layer system | Oxygen flow [sccm] | Targets | Crystal phases in FL | Composition of the FL Zr1OxNy |
|---|---|---|---|---|---|
| 777 | ZrN | 0 | SL: 4xZr | ZrN (cubic F) | x = 0<br>y = 1.1 |
| 778 | SL: ZrN<br>FL: Zr—O—N | 50 | SL: 4x Zr<br>FL: 4xZr | ZrN (cubic F)<br>resp. ZrO (cubic F) | x = 0.12<br>y = 1.12<br>(N/O = 9.3) |
| 779 | SL: ZrN<br>FL: Zr—O—N | 200 | SL: 4x Zr<br>FL: 4xZr | ZrN (cubic F)<br>resp. ZrO (cubic F) | x = 0.74<br>y = 1.26<br>(N/O = 1.7) |
| 799 | SL: ZrN<br>FL: Zr—O—N | 250 | SL: 4x Zr<br>FL: 4xZr | ZrO2/Zr—O—N<br>(cubic F) | x = 1<br>y = 0.61<br>(N/O = 0.6) |
| 793 | SL: ZrN<br>FL: Zr—O—N | 300 | SL: 4x Zr<br>FL: 4xZr | ZrO2/Zr—O—N<br>(cubic F) | x = 1.19<br>y = 0.52<br>(N/O = 0.4) |
| 780 | SL: ZrN<br>FL: Zr—O—N | 400 | SL: 4x Zr<br>FL: 4xZr | ZrO2 (mono-clinic)<br>Zr—O—N (cubic) | x = 2.05<br>y = 0<br>(N/O = 0) |

Legend:
FL function layer
SL substrate layer, intermediary layer

TABLE 2

| Sample | Layer system | Oxygen flow [sccm] | Targets | Crystal phases in FL | Composition of the FL Zr1OxNy |
|---|---|---|---|---|---|
| 909 | SL: ZrN<br>FL: Zr—O—(N) | 350 | SL: 4x Zr | Zr—O<br>(monoclinic) | x = 1.9 |
| 911 | SL: ZrN<br>FL: Zr—Y—O—(N) | 200 | SL: 2x Zr<br>FL: 2xZr | Zr—Y—O<br>(cubic) | x = 1.85 |

TABLE 2-continued

| Sample | Layer system | Oxygen flow [sccm] | Targets | Crystal phases in FL | Composition of the FL Zr1OxNy |
|---|---|---|---|---|---|
| 912 | SL: ZrN<br>FL: Zr—Y—O—(N) | 300 | SL: 2x Zr<br>FL: 2xZr<br>(85 at %)/<br>Y (15 at %) | Zr—Y—O<br>(cubic) | x = 1.80 |
| 910 | SL: ZrN<br>FL: Zr—Y—O—(N) | 350 | SL: 2x Zr<br>FL: 2xZr<br>(85 at %)/<br>Y (15 at %) | Zr—Y—O<br>(cubic) | x = 1.80 |

TABLE 3

| Sample | Layer system | Oxygen flow [sccm] | FWHM (2Θ = 30°) | FWHM (2Θ = 50°) | Estimated size of crystallite [nm] |
|---|---|---|---|---|---|
| 909 | SL: ZrN<br>FL: Zr—O—(N) | 350 | 0.34 | 0.37 | 60 |
| 911 | SL: ZrN<br>FL: Zr—Y—O—(N) | 200 | 0.42 | 0.60 | 32 |
| 912 | SL: ZrN<br>FL: Zr—Y—O—(N) | 300 | 0.40 | 0.49 | 40 |
| 910 | SL: ZrN<br>FL: Zr—Y—O—(N) | 350 | 0.36 | 0.44 | 50 |

TABLE 4

| Sample | Layer system | Oxygen flow [sccm] | Targets | Crystal phases in FL | Composition of the FL Zr1OxNy |
|---|---|---|---|---|---|
| 916 | SL: TiCN<br>FL: Zr—Y—O—(N) | 200 | SL: 4xTi<br>FL: 2xZr<br>(92 at %)/<br>Y (8 at %) | ZrO2<br>(tetragonal,<br>possibly also<br>cubic phase) | x = 1.1<br>y = 0.4<br>(N/O = 0.39) |
| 913 | SL: TiCN<br>FL: Zr—Y—O—(N) | 250 | SL: 4xTi<br>FL: 2xZr<br>(92 at %)/<br>Y (8 at %) | ZrO2<br>(tetragonal,<br>possibly also<br>cubic phase) | x = 1.80<br>y = 0.07<br>(N/O = 0.04) |
| 914 | SL: TiCN<br>FL: Zr—Y—O—(N) | 350 | SL: 4xTi<br>FL: 2xZr<br>(92 at %)/<br>Y (8 at %) | ZrO2<br>(tetragonal,<br>possibly also<br>cubic phase) | x = 1.95<br>y = 0<br>(N/O = 0) |
| 915 | SL: TiCN<br>FL: Zr—Y—O—(N) | 400 | SL: 4xTi<br>FL: 2xZr<br>(92 at %)/<br>Y (8 at %) | ZrO2<br>(tetragonal,<br>possibly also<br>cubic phase) | x = 1.80<br>y = 0<br>(N/O = 0) |
| 917 | SL: ZrN<br>FL: Zr—Y—O—(N)<br>with pronounced<br>ZrN transition | 250 | SL: 4xTi<br>FL: 2xZr<br>(92 at %)/<br>Y (8 at %) | ZrO2 (mainly<br>cubic phase,<br>possibly portion<br>of tetragonal<br>phase) | x = 1.80<br>y = 0.1<br>(N/O = 0.06) |

TABLE 5

| Sample | Layer system | Oxygen flow [sccm] | FWHM (2Θ = 30°) | FWHM (2Θ = 50°) | Estimated size of crystallite [nm] |
|---|---|---|---|---|---|
| 916 | SL: TiCN<br>FL: Zr—Y—O—(N) | 200 | 2.09 | 2.30 | 5 |
| 913 | SL: TiCN<br>FL: Zr—Y—O—(N) | 250 | 0.90 | 1.09 | 11 |

TABLE 5-continued

| Sample | Layer system | Oxygen flow [sccm] | FWHM (2Θ = 30°) | FWHM (2Θ = 50°) | Estimated size of crystallite [nm] |
|---|---|---|---|---|---|
| 914 | SL: TiCN<br>FL: Zr—Y—O—(N) | 350 | 0.44 | 0.63 | 30 |
| 915 | SL: TiCN<br>FL: Zr—Y—O—(N) | 400 | 0.46 | 0.70 | 25 |
| 917 | SL: ZrN<br>FL: Zr—Y—O—(N) with pronounced ZrN transition | 250 | 1.03 | 1.21 | 10 |

What is claimed is:

1. A method for producing a zirconia-based layer on a deposition substrate, comprising:
   providing a mixed spark target in which materials of the mixed spark target are separately present in the target, the materials of the mixed spark target comprising elemental zirconium and at least one stabilizer; and
   depositing the zirconia-based layer on the deposition substrate by using reactive spark evaporation of the mixed spark target using pulsed spark current and/or applying a magnetic field that is perpendicular to the mixed spark target.

2. The method according to claim 1, wherein the layer is produced in a cubic and/or tetragonal crystal structure.

3. The method according to claim 1, wherein an oxygen partial pressure is chosen to be greater than 0.1 Pa.

4. The method according to claim 1, wherein a concentration ratio of zirconia and stabilizer of the layer is essentially given by a concentration ratio of elemental zirconium and stabilizer of the mixed target.

5. The method according to claim 2, wherein, by selecting a concentration of the stabilizers in the mixed target, the cubic and/or tetragonal crystal structure is achieved.

6. The method according to claim 3, wherein an oxygen partial pressure, which is at least essentially a free setting parameter in terms of achieving a cubic and/or tetragonal crystal structure, is used for determining a layer morphology.

7. The method according to claim 1, wherein a reactive gas, in addition to oxygen, includes nitrogen.

8. The method according to claim 7, wherein the layer is produced in a cubic and/or tetragonal crystal structure.

9. The method according to claim 7, wherein, by setting pressure ratios during the reactive spark evaporation, a layer is generated containing zircon, oxygen and nitrogen, with cubic and/or tetragonal crystal structure.

10. The method according to claim 7, wherein a proportion of the oxygen is set through a gas flow control device whilst a proportion of the nitrogen is chosen according to a total pressure control device.

11. The method according to claim 7, wherein the zirconia-based layer is deposited as a pure ZrO2 layer in a cubic crystal structure on a cubic crystallized layer containing zircon, nitrogen and oxygen.

12. The method according to claim 1 or 7 for the production of a layer as a layer in a layer stack.

13. The method according to claim 1 or 7, wherein the layer is produced as multi-layer coating by varying a content of oxygen/nitrogen.

14. The method according to claim 1 or 7, wherein the deposition of the layer occurs at a substrate temperature between 200° C. and 700° C.

15. The method according to claim 1 or 7, wherein a that the forming of a cubic or tetragonal phase occurs while not in a thermal state of equilibrium.

16. The method according to claim 1 or 7, wherein oxides of other metals than zirconium are integrated into a material of the layer.

17. The method according to claim 1 or 7, wherein the deposition substrate has a metallic surface,
   wherein a supporting layer is deposited onto the metallic surface, and the zirconia-based layer is deposited on the supporting layer.

18. The method according to claim 1 or 7, wherein no working gas is used.

19. A method of producing a layer that can revert to a monoclinic phase, the method comprising the producing of the zirconia-based layer on the deposition substrate according to claim 11.

20. A method for producing a solid electrolyte layer in a fuel cell, the method comprising the producing of the zirconia-based layer on the deposition substrate according to claim 1 or 7.

21. The method according to claim 1, 6 or 7, wherein at least one of the following characteristics applies:
   the stabilizer is freely chosen;
   layer composition, phase composition and layer morphology are set at least essentially independently from one another by means of the adjustment of parameters of a vaporization process;
   the layer morphology can be adjusted from glass-like to columnar;
   the solid electrolyte layer is produced without stabilizer;
   the layer is produced with a gradient of the layer material composition in the direction of its thickness dimension, wherein the morphology and phase can be chosen freely.

22. A method for producing the zirconia-based layer as growth substrate for a YSZ, the method comprising the producing of the zirconia-based layer on the deposition substrate according to claim 1 or 7.

23. A method for increasing ion transport along grain boundaries, the method comprising the producing of the zirconia-based layer on the deposition substrate according to claim 1 or 7.

24. The method according to claim 1, wherein the providing of the mixed spark target comprises producing the mixed spark target by densifying the materials without melting the materials, the materials having different melting points.

25. The method according to claim 1, wherein the mixed spark target is produced by hot isostatic pressing (HIP).

26. The method according to claim 1, wherein the zirconia-based layer is deposited on a supporting layer that is deposited on a metallic surface of the deposition substrate, the supporting layer comprising ZrN.

27. The method according to claim 26, wherein the metallic surface comprises Zr.

28. The method according to claim 27, wherein the deposition substrate comprises Zr.

29. The method according to claim 26, wherein the supporting layer consists of ZrN.

30. The method according to claim 1, wherein the deposition substrate comprises Zr.

* * * * *